(12) United States Patent
Uchiyama

(10) Patent No.: US 8,174,109 B2
(45) Date of Patent: May 8, 2012

(54) ELECTRONIC DEVICE AND METHOD OF MANUFACTURING SAME

(75) Inventor: Kenta Uchiyama, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 194 days.

(21) Appl. No.: 12/753,170

(22) Filed: Apr. 2, 2010

(65) Prior Publication Data

US 2010/0252937 A1 Oct. 7, 2010

(30) Foreign Application Priority Data

Apr. 6, 2009 (JP) ................................. 2009-091956

(51) Int. Cl.
*H01L 23/02* (2006.01)
*H01L 23/48* (2006.01)

(52) U.S. Cl. ........ 257/686; 257/723; 257/774; 257/787; 257/E23.169; 438/107; 438/109; 438/118; 438/127

(58) Field of Classification Search .................. 257/686, 257/723, 774, E23.169; 438/109, 107, 118, 438/127

See application file for complete search history.

(56) References Cited

U.S. PATENT DOCUMENTS

| | | | | |
|---|---|---|---|---|
| 5,111,278 A | * | 5/1992 | Eichelberger | ................. 257/698 |
| 5,222,014 A | | 6/1993 | Lin | |
| 5,241,456 A | * | 8/1993 | Marcinkiewicz et al. | .... 361/792 |
| 5,353,498 A | * | 10/1994 | Fillion et al. | ..................... 29/840 |
| 5,497,033 A | * | 3/1996 | Fillion et al. | .................. 257/723 |
| 5,870,289 A | * | 2/1999 | Tokuda et al. | ................. 361/779 |
| 7,514,636 B2 | * | 4/2009 | Sasaki | ............................. 174/252 |
| 7,576,433 B2 | * | 8/2009 | Ishino et al. | .................. 257/777 |
| 2001/0030059 A1 | * | 10/2001 | Sugaya et al. | ................ 174/256 |
| 2006/0131740 A1 | * | 6/2006 | Kawabata et al. | ............ 257/723 |
| 2007/0057358 A1 | * | 3/2007 | Satou et al. | .................... 257/686 |
| 2009/0008798 A1 | * | 1/2009 | Yoshida et al. | ............... 257/777 |

FOREIGN PATENT DOCUMENTS

| | | |
|---|---|---|
| JP | 6-13541 A | 1/1994 |
| WO | WO02/16266 A2 | 2/2002 |
| WO | WO02/33751 A2 | 4/2002 |

\* cited by examiner

*Primary Examiner* — Nitin Parekh
(74) *Attorney, Agent, or Firm* — IPUSA, PLLC

(57) ABSTRACT

An electronic device includes a first semiconductor device and a second semiconductor device. The first semiconductor device includes a first electronic component, a first sealing resin, and a first multilayer interconnection structure including a first interconnection pattern directly connected to a first electrode pad of the first electronic component. The second semiconductor device includes a second electronic component, a second sealing resin, and a second multilayer interconnection structure including a second interconnection pattern directly connected to a second electrode pad of the second electronic component. The first semiconductor device is stacked on and bonded to the second semiconductor device through an adhesive layer with the first multilayer interconnection structure of the first semiconductor device facing toward the second sealing resin of the second semiconductor device. The first interconnection pattern and the second interconnection pattern are connected through a through electrode provided through the adhesive layer and the second sealing resin.

11 Claims, 25 Drawing Sheets

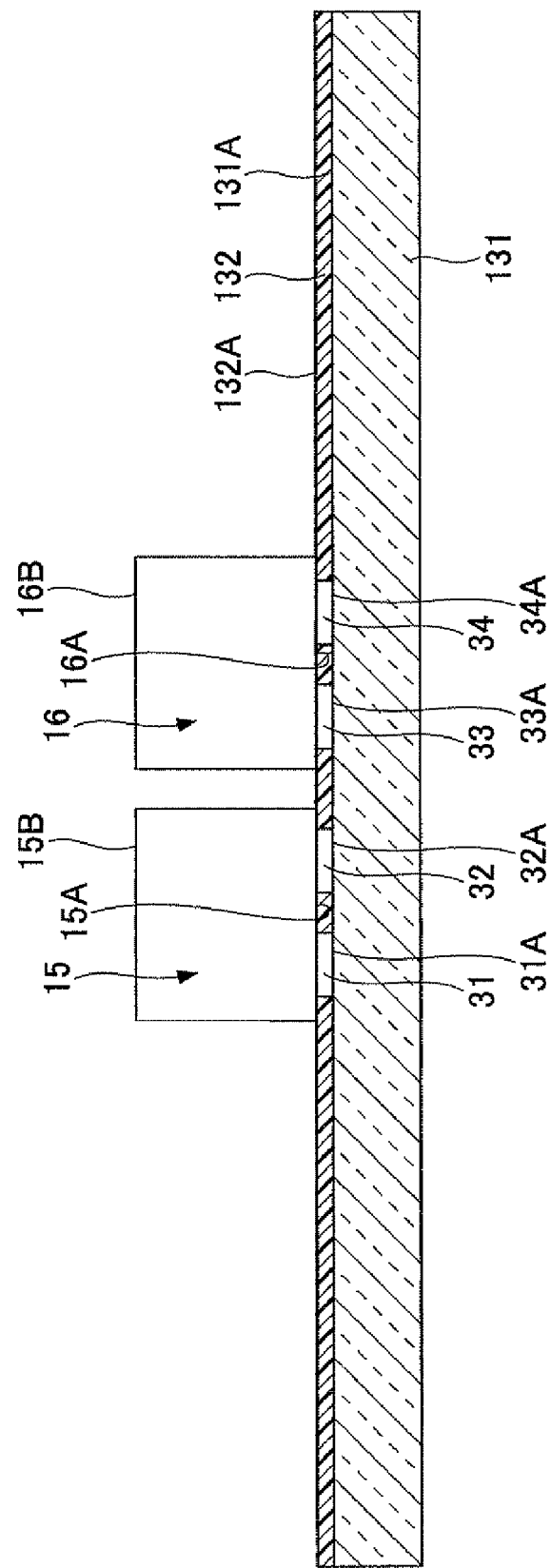

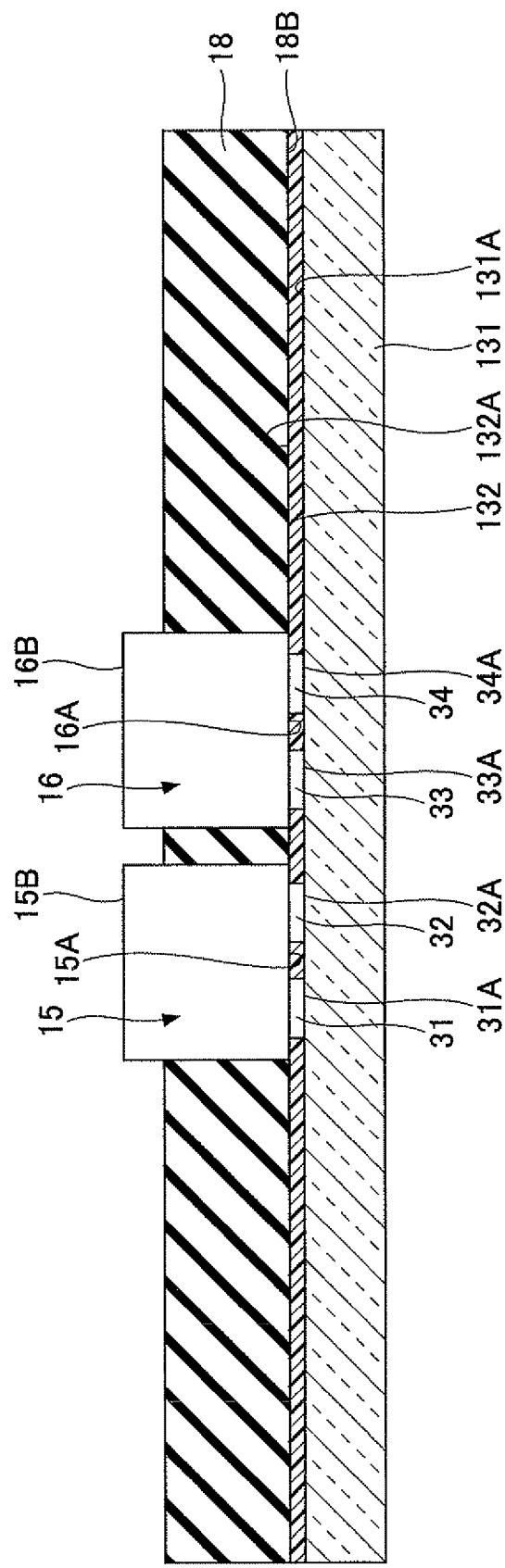

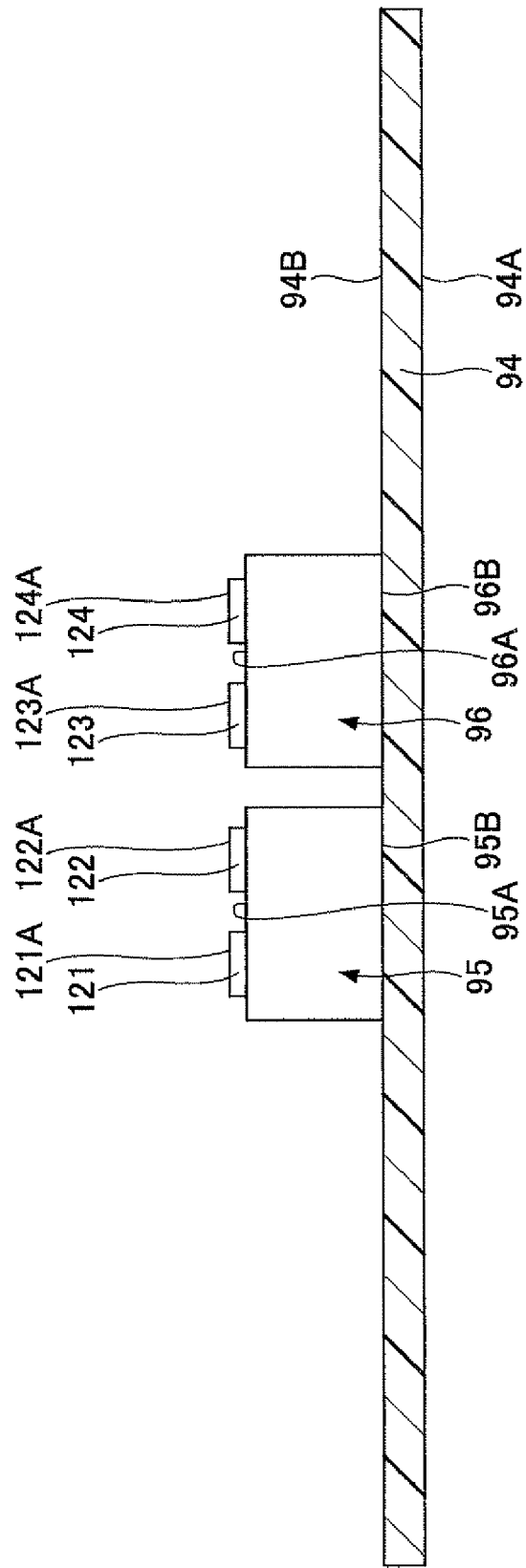

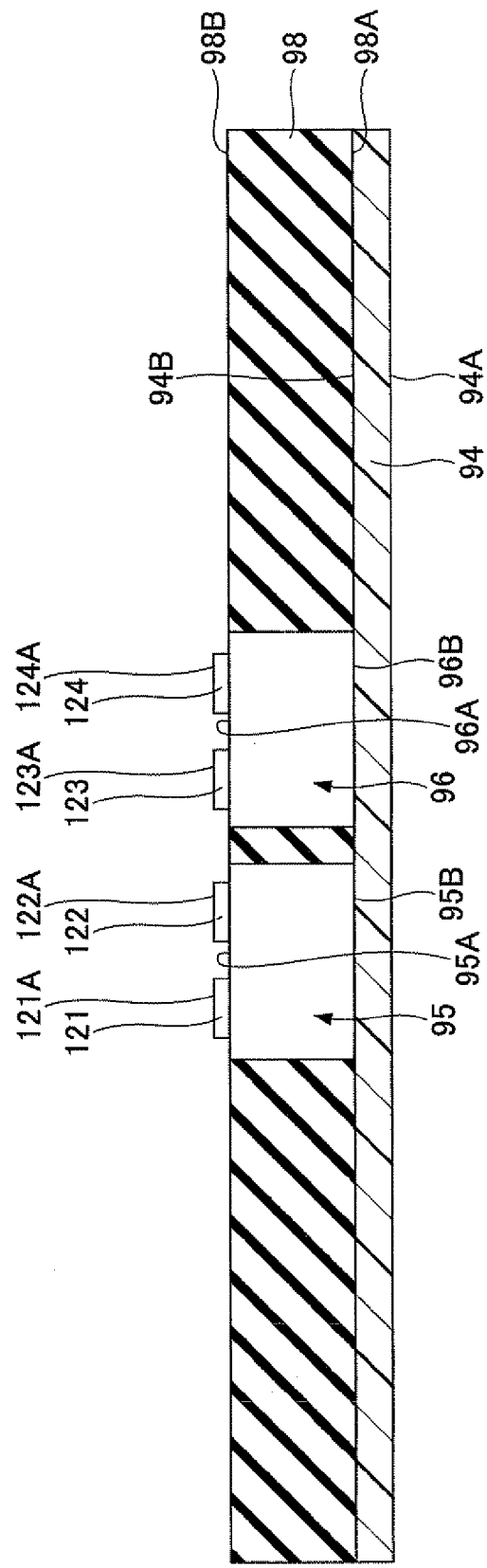

ELECTRONIC DEVICE AND METHOD OF MANUFACTURING SAME

CROSS-REFERENCE TO RELATED APPLICATION

The present application is based upon and claims the benefit of priority of Japanese Patent Application No. 2009-091956, filed on Apr. 6, 2009, the entire contents of which are incorporated herein by reference.

BACKGROUND OF THE INVENTION

1. Field of the Invention

The present invention relates generally to electronic devices and methods of manufacturing the same. In particular, the present invention relates to an electronic device including a first semiconductor device and a second semiconductor device electrically connected to the first semiconductor device, where the first semiconductor device includes a first electronic component and a first multilayer interconnection structure electrically connected to the first electronic component and the second semiconductor device includes a second electronic component and a second multilayer interconnection structure electrically connected to the second electronic component.

2. Description of the Related Art

FIG. 1 is a cross-sectional view of a conventional electronic device 200.

Referring to FIG. 1, the conventional electronic device 200 includes a first semiconductor device 201, a second semiconductor device 202, and internal connection terminals 203. The first semiconductor device 201 includes a wiring board 211 (a first multilayer interconnection structure), a first electronic component 212, underfill resin 213, and external connection terminals 214.

The wiring board 211 is a plate-shaped multilayer interconnection structure. The wiring board 211 includes stacked insulating layers 216 and 217; interconnection patterns 219, 228, and 229; pads 221; solder resist layers 222 and 226; and external connection pads 223 and 224. The insulating layer 216 is provided on an upper surface 217A of the insulating layer 217.

The interconnection patterns 219 and the pads 221 are provided on an upper surface 216A of the insulating layer 216. The interconnection patterns 219 include pad parts 232 and 233, which are not covered with the solder resist layer 222 and are exposed. The pads 221 are not covered with the solder resist layer 222 and are exposed.

The solder resist layer 222 is provided on the upper surface 216A of the insulating layer 216. The external connection pads 223 and 224 are provided on a lower surface 217B of the insulating layer 217. The lower surfaces of the external connection pads 223 and 224 are not covered with the solder resist layer 226 and are exposed.

The solder resist layer 226 is provided on the lower surface 217B of the insulating layer 217. The interconnection patterns 228 and 229 are provided inside the stacked insulating layers 216 and 217. The interconnection patterns 228 are connected to the corresponding pad parts 233 and external connection pads 223. The interconnection patterns 229 are connected to the corresponding pads 221 and external connection pads 224.

The first electronic component 212 is placed between the first semiconductor device 201 and the second semiconductor device 202. The first electronic component 212 includes electrode pads 236. The electrode pads 236 are electrically connected to the corresponding pad parts 232 through bumps 237 (for example, solder bumps).

The underfill resin 213 is provided to fill in the gap between the first electronic component 212 and the wiring board 211. The external connection terminals 214 are provided on the lower surfaces of the corresponding external connection pads 223 and 224.

The second semiconductor device 202 is provided over the first semiconductor device 201. The second semiconductor device 202 includes a wiring board 241 (a second multilayer interconnection structure), a second electronic component 243, and molded resin 246. The wiring board 241 has a plate shape, and includes pads 251, 252 and 254. The pads 251 face the pad parts 233, and are electrically connected to the pad parts 233 through the corresponding internal connection terminals 203. The pads 252 face the pads 221, and are electrically connected to the pads 221 through the corresponding internal connection terminals 203. The pads 254 are electrically connected to the pads 251 or the pads 252.

The second electronic component 243 is bonded onto the wiring board 241, and is electrically connected to the pads 254 through metal wires 244. The molded resin 246 is provided on the wiring board 241. The molded resin 246 seals the metal wires 244 and the second electronic component 243.

The diameter (height) of the internal connection terminals 203 is determined so that the first electronic component 212 and the second semiconductor device 202 are out of contact with each other. The internal connection terminals 203 may have a height of, for example, 200 μm. (See, for example, Japanese Laid-Open Patent Application No. 6-13541.)

SUMMARY OF THE INVENTION

According to one aspect of the present invention, an electronic device includes a first semiconductor device including a first electronic component having a first surface and a second surface facing away from each other, the first surface having a first electrode pad provided thereon; a first sealing resin having a first surface and a second surface facing away from each other, the first sealing resin sealing side surfaces of the first electronic component so that the first surface and the second surface of the first electronic component are exposed at the first surface and the second surface, respectively, of the first sealing resin; and a first multilayer interconnection structure including a plurality of insulating layers and a first interconnection pattern, the insulating layers being stacked to cover the first surface of the first electronic component and the first surface of the first sealing resin, the first interconnection pattern being directly connected to the first electrode pad; and a second semiconductor device including a second electronic component having a first surface and a second surface facing away from each other, the first surface having a second electrode pad provided thereon; a second sealing resin having a first surface and a second surface facing away from each other, the second sealing resin sealing side surfaces of the second electronic component so that the first surface and the second surface of the second electronic component are exposed at the first surface and the second surface, respectively, of the second sealing resin; and a second multilayer interconnection structure including a plurality of insulating layers and a second interconnection pattern, the insulating layers being stacked to cover the first surface of the second electronic component and the first surface of the second sealing resin, the second interconnection pattern being directly connected to the second electrode pad, wherein the first semiconductor device is stacked on and bonded to the second semiconductor device through an adhesive layer with the first multilayer interconnection structure of the first semiconductor device facing toward the second sealing resin of the second semiconductor device, and the first interconnection pattern and the second interconnection pattern are connected through a through electrode provided through the adhesive layer and the second sealing resin.

According to one aspect of the present invention, a method of manufacturing an electronic device includes: forming a first semiconductor device including a first electronic component having a first surface and a second surface facing away from each other, the first surface having a first electrode pad provided thereon; a first sealing resin having a first surface and a second surface facing away from each other, the first sealing resin being provided to seal side surfaces of the first electronic component so that the first surface and the second surface of the first electronic component are exposed at the first surface and the second surface, respectively, of the first sealing resin; and a first multilayer interconnection structure including a plurality of insulating layers and a first interconnection pattern, the insulating layers being stacked to cover the first surface of the first electronic component and the first surface of the first sealing resin, the first interconnection pattern being directly connected to the first electrode pad; and forming a second semiconductor device, which includes preparing a second electronic component having a first surface and a second surface facing away from each other, the first surface having a second electrode pad provided thereon, and forming a second sealing resin having a first surface and a second surface facing away from each other, the second sealing resin sealing side surfaces of the second electronic component so that the first surface and the second surface of the second electronic component are exposed at the first surface and the second surface, respectively, of the second sealing resin; stacking the second sealing resin on the first multilayer interconnection structure with an adhesive layer being interposed between the second surface of the second sealing resin and the first multilayer interconnection structure; forming a through electrode through the second sealing resin and the adhesive layer, the through electrode being connected to the first interconnection pattern; and forming a second multilayer interconnection structure including a plurality of insulating layers and a second interconnection pattern, the insulating layers being stacked to cover the first surface of the second electronic component and the first surface of the second sealing resin, the second interconnection pattern being directly connected to the second electrode pad.

The object and advantages of the embodiments will be realized and attained by means of the elements and combinations particularly pointed out in the claims.

It is to be understood that both the foregoing general description and the following detailed description are exemplary and explanatory and not restrictive of the invention as claimed.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

Figure 1:
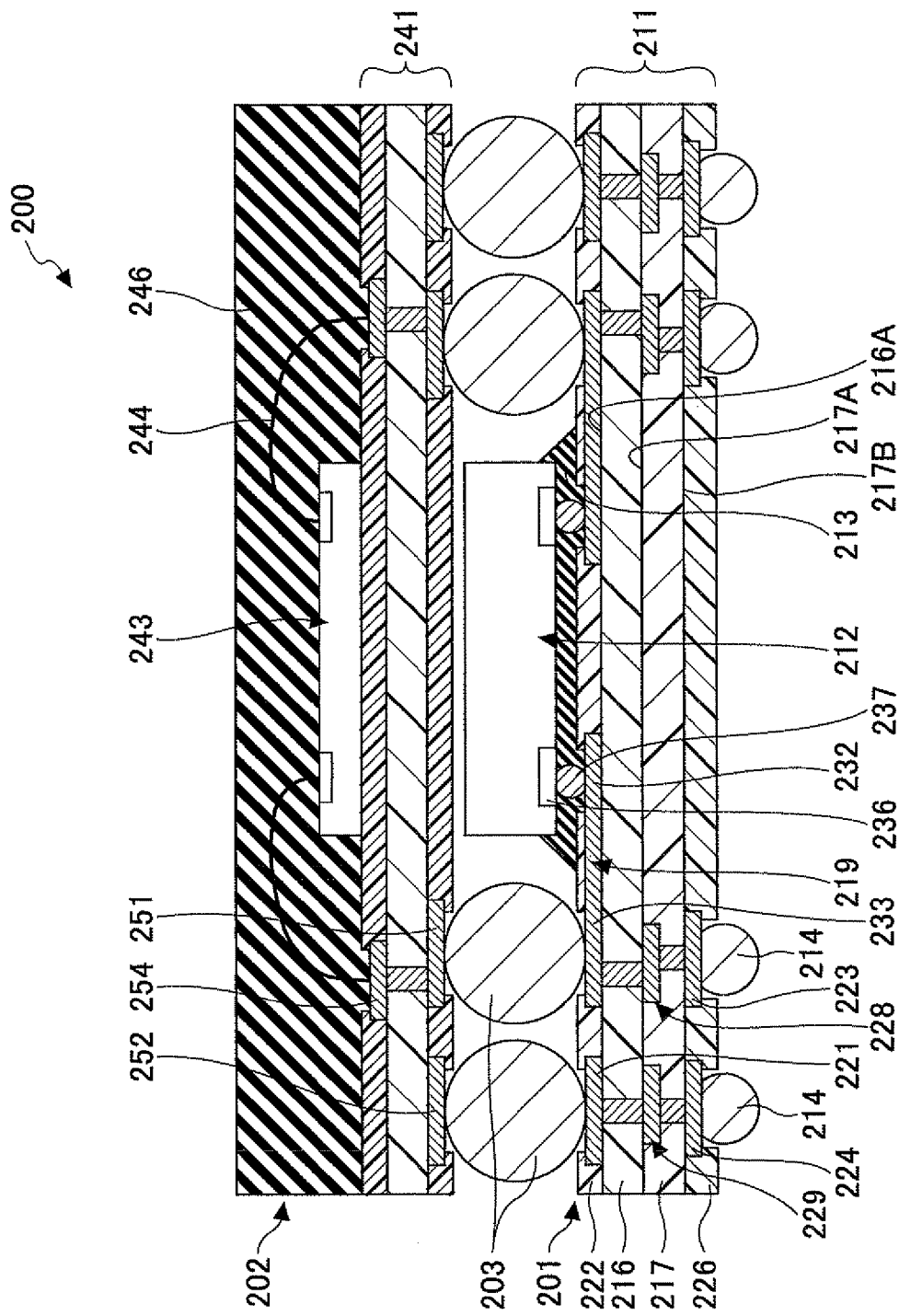
FIG. 1 is a cross-sectional view of a conventional electronic device.

According to the above-described conventional electronic device 200 of FIG. 1, the first electronic component 212 provided on the upper surface side of the wiring board 211 and the wiring board 211 are electrically connected through the bumps 237. Accordingly, there is a problem in that the electronic device 200 as well as the first semiconductor device 201 is large in size in the directions of its thickness.

Further, according to the conventional electronic device 200, the height (diameter) of the internal connection terminals 203 that electrically connect the first semiconductor device 201 and the second semiconductor device 202 needs to be larger than the sum of the height of the first electronic component 212 and the height of the bumps 237. Therefore, there is a problem in that the electronic device 200 is large in size in the directions of its thickness.

Furthermore, according to the conventional electronic device 200, there is also the problem of a decrease in the reliability of the electrical connection between the first semiconductor device 201 and the second semiconductor device if solder balls are used as the internal connection terminals 203.

The problem of increases in the sizes of the first semiconductor device 201 and the electronic device 200 in their thickness directions also occurs in the case of connecting the first electronic component 212 and the wiring board 211 by wire bonding.

According to one aspect of the present invention, there are provided an electronic device that is reduced in size in its thickness directions with increased reliability of the electrical connection between a first semiconductor device and a second semiconductor device and a method of manufacturing such an electronic device.

A description is given, with reference to the accompanying drawings, of embodiments of the present invention.

[a] First Embodiment

Figure 2A:
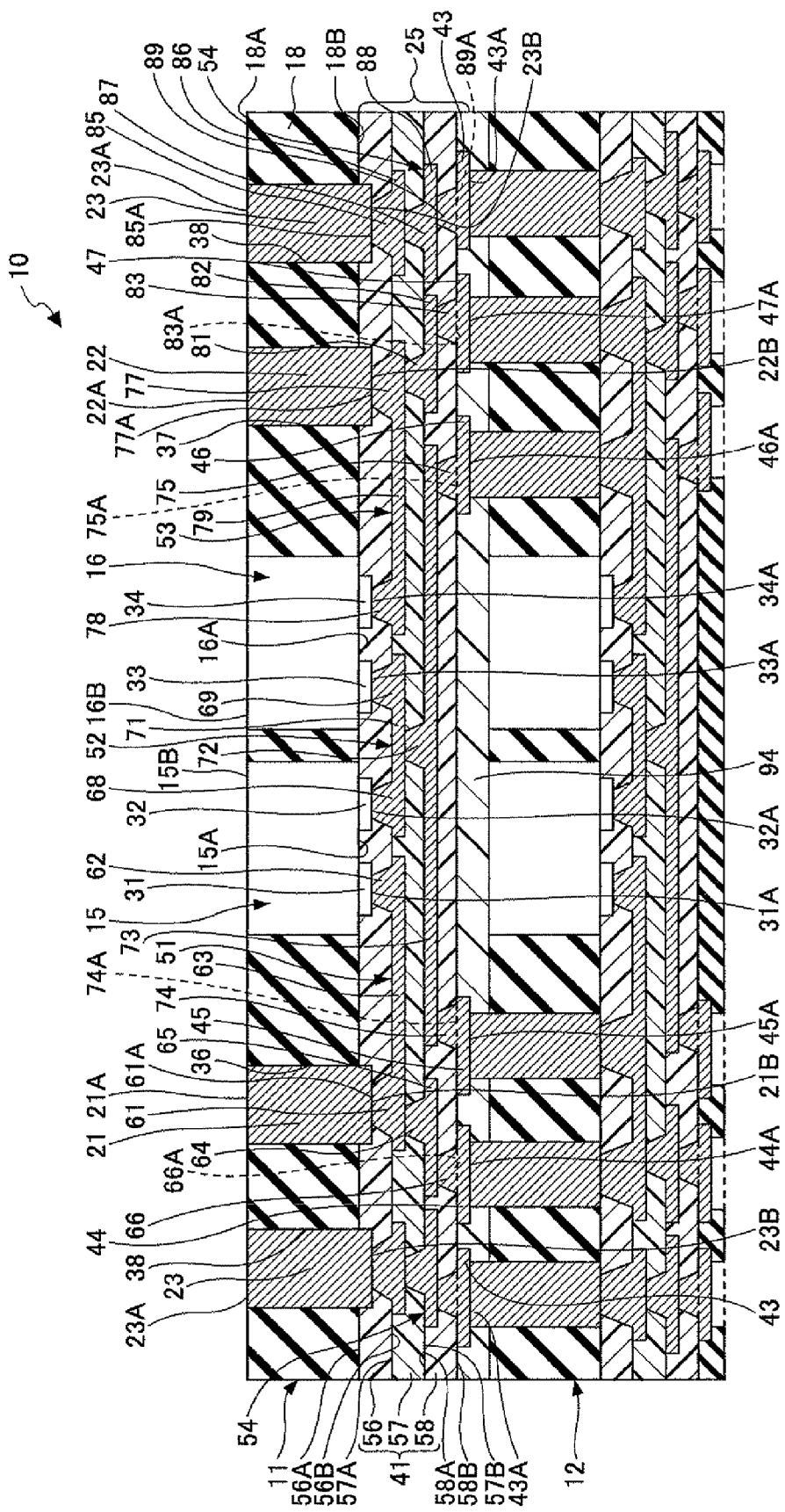
FIGS. 2A and 2B are cross-sectional views of an electronic device according to a first embodiment of the present invention.
Figure 2B:
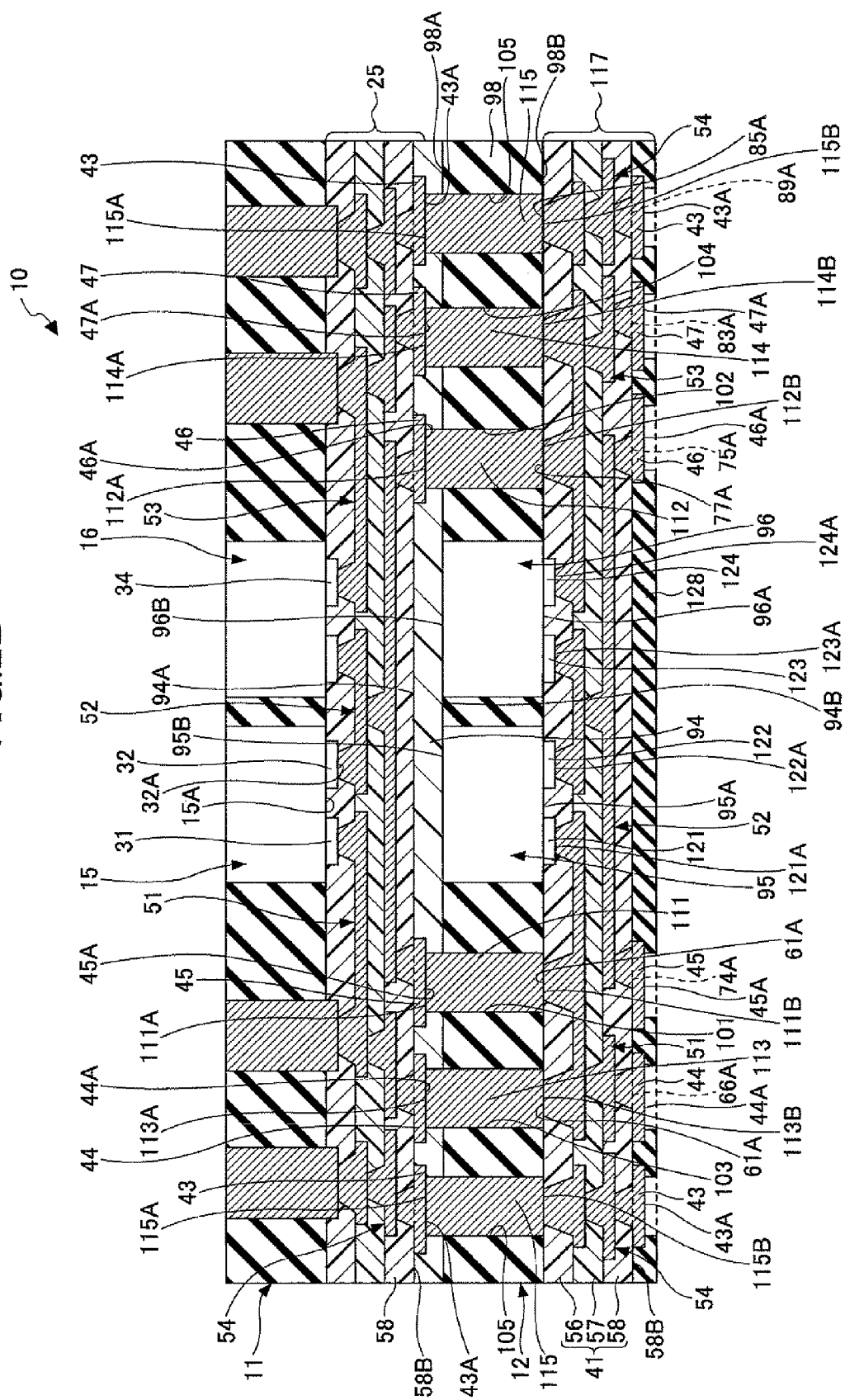

FIGS. 2A and 2B are cross-sectional views of an electronic device 10 according to a first embodiment of the present invention.

Referring to FIGS. 2A and 2B, the electronic device 10 according to the first embodiment includes a first semiconductor device 11 and a second semiconductor device 12.

Referring to FIG. 2A, the first semiconductor device 11 includes first electronic components 15 and 16; sealing resin 18; through electrodes 21, 22, and 23; and a first multilayer interconnection structure 25.

The first electronic component 15 has a thin plate shape and may be, for example, 200 μm to 300 μm in thickness. The first electronic component 15 includes a first electrode pad 31 having a connection surface 31A; a first electrode pad 32 having a connection surface 32A; an electrode pad formation surface 15A on which the first electrode pads 31 and 32 are formed; and a rear surface 15B on the side opposite to (facing away from) the electrode pad formation surface 15A.

The first electronic component 16 has a thin plate shape and may be, for example, 200 μm to 300 μm in thickness. The first electronic component 16 includes a first electrode pad 33 having a connection surface 33A; a first electrode pad 34 having a connection surface 34A; an electrode pad formation surface 16A on which the first electrode pads 33 and 34 are formed; and a rear surface 16B on the side opposite to (facing away from) the electrode pad formation surface 16A.

The first electronic components 15 and 16 may be, for example, semiconductor chips. By way of example, the first electronic components 15 and 16 may be semiconductor chips for CPUs (Central Processing Units); one of the first electronic components 15 and 16 may be a semiconductor chip for a CPU and the other one of the first electronic components 15 and 16 may be a semiconductor chip for a memory; or one of the first electronic components 15 and 16 may be a semiconductor chip for a CPU and the other one of the first electronic components 15 and 16 may be a semiconductor chip for a GPU (Graphics Processing Unit).

The sealing resin 18 is provided around the first electronic components 15 and 16 to seal the side surfaces of the first electronic components 15 and 16. The sealing resin 18 is substantially equal in thickness to the first electronic components 15 and 16. The sealing resin 18 may be, for example, 200 µm to 300 µm in thickness.

The sealing resin 18 has a surface 18A and a multilayer interconnection structure formation surface 18B on the side opposite to (facing away from) the surface 18A. The rear surfaces 15B and 16B of the first electronic components 15 and 16, respectively, are exposed at the surface 18A of the sealing resin 18. The surface 18A of the sealing resin 18 is substantially level with the rear surfaces 15B and 16B of the first electronic components 15 and 16. As a result, the surface 18A of the sealing resin 18 and the rear surfaces 15B and 16B of the first electronic components 15 and 16 are in substantially the same plane (that is, substantially form a single surface).

By thus configuring the sealing resin 18, sealing the side surfaces of the first electronic components 15 and 16, so that the surface 18A is substantially level with the rear surfaces 15B and 16B of the first electronic components 15 and 16, it is possible to seal the side surfaces of the first electronic components 15 and 16 without an increase in the size of the first semiconductor device 11 in its thickness directions (vertical directions in FIG. 2A).

The electrode pad formation surfaces 15A and 16A of the first electronic components 15 and 16 and the first electrode pads 31 through 34 are exposed at the multilayer interconnection structure formation surface 18B of the sealing resin 18. The multilayer interconnection structure formation surface 18B is substantially level with the electrode pad formation surfaces 15A and 16A. The first multilayer interconnection structure 25 is formed on the multilayer interconnection structure formation surface 18B.

Through holes 36, 37, and 38 are formed in the sealing resin 18. The through holes 36 through 38 are formed through part of the sealing resin 18 around the first electronic components 15 and 16. The through holes 36 through 38 may be, for example, 200 µm in diameter.

The sealing resin 18 may be, for example, molded resin, whose material may be, for example, epoxy resin.

The through electrode 21 is provided in the through hole 36. The through electrode 21 has an end surface 21A in the same plane as the rear surfaces 15B and 16B of the first electronic components 15 and 16 and the surface 18A of the sealing resin 18. The end surface 21A of the through electrode 21 serves as, for example, a connection surface for mounting another electronic component (not graphically illustrated).

An end part of the through electrode 21 on which another end surface 21B is formed projects from the multilayer interconnection structure formation surface 18B. The end surface 21B of the through electrode 21 is in the same plane as the connection surfaces 31A, 32A, 33A, and 34A of the first electrode pads 31, 32, 33, and 34, respectively.

The through electrode 21 having the above-described configuration may be formed by, for example, plating. Examples of the material of the through electrode 21 include Cu.

The through electrode 22 is provided in the through hole 37. The through electrode 22 has an end surface 22A in the same plane as the rear surfaces 15B and 16B of the first electronic components 15 and 16 and the surface 18A of the sealing resin 18. The end surface 22A of the through electrode 22 serves as, for example, a connection surface for mounting another electronic component (not graphically illustrated).

An end part of the through electrode 22 on which another end surface 22B is formed projects from the multilayer interconnection structure formation surface 18B. The end surface 22B of the through electrode 22 is in the same plane as the connection surfaces 31A, 32A, 33A, and 34A of the first electrode pads 31, 32, 33, and 34, respectively.

The through electrodes 22 having the above-described configuration may be formed by, for example, plating. Examples of the material of the through electrode 22 include Cu.

The through electrodes 23 are provided in the corresponding through holes 38. The through electrodes 23 have respective end surfaces 23A in the same plane as the rear surfaces 15B and 16B of the first electronic components 15 and 16 and the surface 18A of the sealing resin 18. The end surfaces 22A of the through electrodes 23 serve as, for example, connection surfaces for mounting another electronic component (not graphically illustrated).

End parts of the through electrodes 23 on which respective other end surfaces 23B are formed project from the multilayer interconnection structure formation surface 18B. The end surfaces 23B of the through electrodes 23 are in the same plane as the connection surfaces 31A, 32A, 33A, and 34A of the first electrode pads 31, 32, 33, and 34, respectively.

The through electrodes 23 having the above-described configuration may be formed by, for example, plating. Examples of the material of the through electrodes 23 include Cu.

As described above, the end surfaces 21A, 22A, and 23A of the through electrodes 21, 22, and 23, respectively, are placed in the same plane as the rear surfaces 15B and 16B of the first electronic components 15 and 16 and the surface 18A of the sealing resin 18. As a result, the first semiconductor device 11 has a flat surface on the side opposite to the surface facing toward the second semiconductor device 12.

The first multilayer interconnection structure 25 includes a layered body 41, external connection pads 43, 44, 45, 46, and 47 serving as first pads, and interconnection patterns 51, 52, 53, and 54 serving as first interconnection patterns.

The layered body 41 includes a stack of multiple insulating layers 56, 57, and 58. The insulating layer 56 is provided on the electrode pad formation surfaces 15A and 16A of the first electronic components 15 and 16, the multilayer interconnection structure formation surface 18B of the sealing resin 18, the parts of the through electrodes 21 through 23 projecting from the multilayer interconnection structure formation surface 18B, and the first electrode pads 31 through 34. The insulating layer 56 may be, for example, an insulating resin layer (such as an epoxy resin layer). The insulating layer 56 may be, for example, 5 µm to 30 µm in thickness.

The insulating layer 56 has a surface 56A in contact with the sealing resin 18 and a surface 56B facing away from (on the side opposite to) the surface 56A. The surface 56A corresponds to a first surface of the layered body 41. The insulating layer 57 is provided on the surface 56B of the insulating layer 56. The insulating layer 57 may be, for example, an insulating resin layer (such as an epoxy resin layer). The insulating layer 57 may be, for example, 5 µm to 30 µm in thickness.

The insulating layer 57 has a surface 57A in contact with the insulating layer 56 and a surface 57B facing away from (on the side opposite to) the surface 57A. The insulating layer 58 is provided on the surface 57B of the insulating layer 57. The insulating layer 58 may be, for example, an insulating resin layer (such as an epoxy resin layer). The insulating layer 58 may be, for example, 5 µm to 30 µm in thickness.

The insulating layer 58 has a surface 58A in contact with the insulating layer 57 and a surface 58B facing away from (on the side opposite to) the surface 58A. The surface 58B corresponds to a second surface of the layered body 41. The external connection pads 43 through 47 are provided on the surface 58B of the insulating layer 58. The external connection pads 43 through 47 have respective connection surfaces 43A, 44A, 45A, 46A, and 47A. The connection surfaces 43A through 47A are electrically connected to the second semiconductor device 12.

The interconnection patterns 51 through 54 are provided inside the layered body 41. The interconnection pattern 51 includes vias 61, 62, 64, and 66 and interconnects 63 and 65. The via 61 is provided through part of the insulating layer 56 facing the through electrode 21. The via 61 has a connection surface 61A. The connection surface 61A is connected to the end surface 21B of the through electrode 21. As a result, the interconnection pattern 51 is electrically connected to the through electrode 21.

The via 62 is provided through part of the insulating layer 56 facing the connection surface 31A of the first electrode pad 31. The via 62 is directly connected to (or in direct contact with) the connection surface 31A of the first electrode pad 31. As a result, the interconnection pattern 51 is electrically connected to the first electronic component 15.

The interconnect 63 is provided on the surface 56B of the insulating layer 56. The interconnect 63 forms a unitary structure with the end parts of the vias 61 and 62 positioned on the surface 56B side in the insulating layer 56. Thereby, the interconnect 63 electrically connects the first electronic component 15 and the through electrode 21.

The via 64 is provided through part of the insulating layer 57 facing the interconnect 63. As a result, the via 64 is connected to the interconnect 63.

The interconnect 65 is provided on the surface 57B of the insulating layer 57. The interconnect 65 forms a unitary structure with the end part of the via 64 positioned on the surface 57B side in the insulating layer 57. As a result, the interconnect 65 is electrically connected to the via 64.

The via 66 is provided through part of the insulating layer 58 between the interconnect 65 and the external connection pad 44. As a result, the via 66 is connected to the interconnect 65. The via 66 has a connection surface 66A. The connection surface 66A is connected to the external connection pad 44.

Thereby, the interconnection pattern 51 electrically connects the first electronic component 15, the through electrode 21, and the external connection pad 44. The end part of the via 66 positioned on the surface 58B side in the insulating layer 58 forms a unitary structure with the external connection pad 44. Examples of the material of the interconnection pattern 51 include Cu.

The interconnection pattern 52 includes vias 68, 69, 72, 74, and 75 and interconnects 71 and 73. The via 68 is provided through part of the insulating layer 56 facing the connection surface 32A of the first electrode pad 32. The via 68 is directly connected to (or in direct contact with) the connection surface 32A of the first electrode pad 32. As a result, the interconnection pattern 52 is electrically connected to the first electronic component 15.

The via 69 is provided through part of the insulating layer 56 facing the connection surface 33A of the first electrode pad 33. The via 69 is directly connected to (or in direct contact with) the connection surface 33A of the first electrode pad 33. As a result, the interconnection pattern 52 is electrically connected to the first electronic component 16.

The interconnect 71 is provided on the surface 56B of the insulating layer 56. The interconnect 71 forms a unitary structure with the end parts of the vias 68 and 69 positioned on the surface 56B side in the insulating layer 56. Thereby, the interconnect 71 electrically connects the first electronic components 15 and 16.

The via 72 is provided through part of the insulating layer 57 facing the interconnect 71. As a result, the via 72 is connected to the interconnect 71.

The interconnect 73 is provided on the surface 57B of the insulating layer 57. The interconnect 73 forms a unitary structure with the end part of the via 72 positioned on the surface 57B side in the insulating layer 57. As a result, the interconnect 73 is electrically connected to the via 72.

The via 74 is provided through part of the insulating layer 58 between the interconnect 73 and the external connection pad 45. As a result, the via 74 is connected to the interconnect 73. The via 74 has a connection surface 74A. The connection surface 74A is connected to the external connection pad 45. As a result, the external connection pad 45 is electrically connected to the first electronic components 15 and 16. The end part of the via 74 positioned on the surface 58B side in the insulating layer 58 forms a unitary structure with the external connection pad 45.

The via 75 is provided through part of the insulating layer 58 between the interconnect 73 and the external connection pad 46. As a result, the via 75 is connected to the interconnect 73. The via 75 has a connection surface 75A. The connection surface 75A is connected to the external connection pad 46. As a result, the external connection pad 46 is electrically connected to the first electronic components 15 and 16. The end part of the via 75 positioned on the surface 58B side in the insulating layer 58 forms a unitary structure with the external connection pad 46. The interconnection pattern 52 is electrically connected to the first electronic components 15 and 16 and the external connection pads 45 and 46. Examples of the material of the interconnection pattern 52 include Cu.

The interconnection pattern 53 includes vias 77, 78, 81, and 83 and interconnects 79 and 82. The via 77 is provided through part of the insulating layer 56 facing the through electrode 22. The via 77 has a connection surface 77A. The connection surface 77A is connected to the end surface 22B of the through electrode 22. As a result, the interconnection pattern 53 is electrically connected to the through electrode 22.

The via 78 is provided through part of the insulating layer 56 facing the connection surface 34A of the first electrode pad 34. The via 78 is directly connected to (or in direct contact with) the connection surface 34A of the first electrode pad 34. As a result, the interconnection pattern 53 is electrically connected to the first electronic component 16.

The interconnect 79 is provided on the surface 56B of the insulating layer 56. The interconnect 79 forms a unitary structure with the end parts of the vias 77 and 78 positioned on the surface 56B side in the insulating layer 56. Thereby, the interconnect 79 electrically connects the first electronic component 16 and the through electrode 22.

The via 81 is provided through part of the insulating layer 57 facing the interconnect 79. As a result, the via 81 is connected to the interconnect 79.

The interconnect 82 is provided on the surface 57B of the insulating layer 57. The interconnect 82 forms a unitary structure with the end part of the via 81 positioned on the surface 57B side in the insulating layer 57. As a result, the interconnect 82 is electrically connected to the via 81.

The via 83 is provided through part of the insulating layer 58 between the interconnect 82 and the external connection pad 47. As a result, the via 83 is connected to the interconnect 82. The via 83 has a connection surface 83A. The connection surface 83A is connected to the external connection pad 47. Thereby, the interconnection pattern 53 electrically connects the first electronic component 15, the through electrode 22, and the external connection pad 47. The end part of the via 83 positioned on the surface 58B side in the insulating layer 58 forms a unitary structure with the external connection pad 47. Examples of the material of the interconnection pattern 53 include Cu.

Directly connecting the first electrode pads 31 through 34 of the first electronic components 15 and 16 with the interconnection patterns 51 through 53 as described above eliminates the necessity of bumps for electrically connecting the first electronic components 15 and 16 and the first multilayer interconnection structure 25. As a result, the first semiconductor device 11 is reduced in size in its thickness directions.

The interconnection patterns 54 have vias 85, 87, and 89 and interconnects 86 and 88. The vias 85 are provided through parts of the insulating layer 56 facing the through electrodes 23. The vias 85 have respective connection surfaces 85A. The connection surfaces 85A are connected to the end surfaces 23B of the corresponding through electrodes 23. As a result, the interconnection patterns 54 are electrically connected to the corresponding through electrodes 23.

The interconnects 86 are provided on the surface 56B of the insulating layer 56. The interconnects 86 form respective unitary structures with the end parts of the corresponding vias 85 positioned on the surface 56B side in the insulating layer 56. As a result, the interconnects 86 are electrically connected to the corresponding vias 85.

The vias 87 are provided through parts of the insulating layer 57 facing the interconnects 86. As a result, the vias 87 are connected to the corresponding interconnects 86.

The interconnects 88 are provided on the surface 57B of the insulating layer 57. The interconnects 88 form respective unitary structures with the end parts of the corresponding vias 87 positioned on the surface 57B side in the insulating layer 57. As a result, the interconnects 88 are electrically connected to the corresponding vias 87.

The vias 89 are provided through parts of the insulating layer 58 between the corresponding interconnects 88 and external connection pads 43. As a result, the vias 89 are connected to the corresponding interconnects 88. The vias 89 have respective connection surfaces 89A. The connection surfaces 89A are connected to the corresponding external connection pads 43. Thereby, the interconnection patterns 54 electrically connect the through electrodes 23 and the corresponding external connection pads 43. The end parts of the vias 89 positioned on the surface 58B side in the insulating layer 58 form respective unitary structures with the corresponding external pads 43. Examples of the material of the interconnection patterns 54 include Cu.

The first multilayer interconnection structure 25 having the above-described configuration is smaller in thickness than the first electronic components 15 and 16 and the sealing resin 18.

The first multilayer interconnection structure 25 may be, for example, 100 μm in thickness.

According to the first semiconductor device 11 having the above-described configuration, the first electrode pads 31 through 34 of the first electronic components 15 and 16 and the interconnection patterns 51 through 53 are directly connected to eliminate the necessity of bumps for electrically connecting the first electronic components 15 and 16 and the first multilayer interconnection structure 25. As a result, the first semiconductor device 11 is reduced in size in its thickness directions.

Referring to FIG. 2B as well as FIG. 2A, the second semiconductor device 12 includes an adhesive layer 94, second electronic components 95 and 96, sealing resin 98, through holes 101, 102, 103, 104, and 105, through electrodes 111, 112, 113, 114, and 115, and a second multilayer interconnection structure 117.

The adhesive layer 94 has a surface 94A and an electronic component placement surface 94B facing away from (on the side opposite to) the surface 94A. The adhesive layer is provided so as to cover the surface 58B of the insulating layer 58 of the first semiconductor device 11 and the external connection pads 43 through 47 provided on the surface 58B. As a result, the surface 94A of the adhesive layer 94 is in contact with the surface 58B of the insulating layer 58.

For example, an epoxy resin film may be used for the adhesive layer 94. In this case, the adhesive layer 94 may be, for example, 50 μm in thickness.

The second electronic component 95 has a thin plate shape and may be, for example, 200 μm to 300 μm in thickness. The second electronic component 95 includes a second electrode pad 121 having a connection surface 121A; a second electrode pad 122 having a connection surface 122A; an electrode pad formation surface 95A on which the second electrode pads 121 and 122 are formed; and a rear surface 95B on the side opposite to (facing away from) the electrode pad formation surface 95A. The rear surface 95B of the second electronic component 95 is bonded to the electronic component placement surface 94B of the adhesive layer 94.

The second electronic component 96 has a thin plate shape and is substantially equal in thickness to the second electronic component 95. The second electronic component 96 may be, for example, 200 μm to 300 μm in thickness. The second electronic component 96 includes a second electrode pad 123 having a connection surface 123A; a second electrode pad 124 having a connection surface 124A; an electrode pad formation surface 96A on which the second electrode pads 123 and 124 are formed; and a rear surface 965 on the side opposite to (facing away from) the electrode pad formation surface 96A. The rear surface 96B of the second electronic component 96 is bonded to the electronic component placement surface 94B of the adhesive layer 94.

The second electronic components 95 and 96 may be, for example, semiconductor chips. By way of example, the second electronic components 95 and 96 may be semiconductor chips for CPUs (Central Processing Units); one of the second electronic components 95 and 96 may be a semiconductor chip for a CPU and the other one of the first electronic components 95 and 96 may be a semiconductor chip for a memory; or one of the first electronic components 95 and 96 may be a semiconductor chip for a CPU and the other one of the first electronic components 95 and 96 may be a semiconductor chip for a GPU (Graphics Processing Unit).

The sealing resin 98 is provided on the electronic component placement surface 94B and around the second electronic components 95 and 96 to seal the side surfaces of the second electronic components 95 and 96. The sealing resin 98 is substantially equal in thickness to the second electronic components 95 and 96. The sealing resin 98 may be, for example, 200 μm to 300 μm in thickness.

The sealing resin 98 has a surface 98A and a multilayer interconnection structure formation surface 98B on the side opposite to (facing away from) the surface 98A. The rear surfaces 95B and 96B of the second electronic components 95 and 96, respectively, are exposed at the surface 98A of the sealing resin 98. The surface 98A of the sealing resin 98 is substantially level with the rear surfaces 95B and 96B of the second electronic components 95 and 96. As a result, the surface 98A of the sealing resin 98 and the rear surfaces 95B and 96B of the second electronic components 95 and 96 are in substantially the same plane (that is, substantially form a single surface).

By thus configuring the sealing resin 98, sealing the side surfaces of the second electronic components 95 and 96, so that the surface 98A is substantially level with the rear surfaces 95B and 96B of the second electronic components 95 and 96, it is possible to seal the side surfaces of the second electronic components 95 and 96 without an increase in the size of the second semiconductor device 12 in its thickness directions (vertical directions in FIG. 2B).

The electrode pad formation surfaces 95A and 96A of the second electronic components 95 and 96 and the second electrode pads 121 through 124 are exposed at the multilayer interconnection structure formation surface 98B of the sealing resin 98. The multilayer interconnection structure formation surface 98B is substantially level with the electrode pad formation surfaces 95A and 96A.

The sealing resin 98 may be, for example, molded resin, whose material may be, for example, epoxy resin.

The through hole 101 is formed through part of the adhesive layer 94 and part of the sealing resin 98 which parts face the external connection pad 45 of the semiconductor device 11, so as to expose the connection surface 45A of the external connection pad 45.

The through hole 102 is formed through part of the adhesive layer 94 and part of the sealing resin 98 which parts face the external connection pad 46 of the first semiconductor device 11, so as to expose the connection surface 46A of the external connection pad 46.

The through hole 103 is formed through part of the adhesive layer 94 and part of the sealing resin 98 which parts face the external connection pad 44 of the semiconductor device 11, so as to expose the connection surface 44A of the external connection pad 44.

The through hole 104 is formed through part of the adhesive layer 94 and part of the sealing resin 98 which parts face the external connection pad 47 of the first semiconductor device 11, so as to expose the connection surface 47A of the external connection pad 47.

The through holes 105 are formed through parts of the adhesive layer 94 and parts of the sealing resin 98 which parts face the external connection pads 43 of the first semiconductor device 11, so as to expose the connection surfaces 43A of the external connection pad 43.

The through holes 101 through 105 configured as described above may be, for example, 200 μm in diameter.

The through electrode 111 is provided in the through hole 101. The through electrode 111 has an end surface 111A connected to the connection surface 45A of the external connection pad 45 of the first semiconductor device 11. As a result, the through electrode 111 is electrically connected to the first semiconductor device 11.

The through electrode 111 has another end surface 111B in substantially the same plane as the electrode pad formation surfaces 95A and 96A of the second electronic components 95 and 96 and the multilayer interconnection structure formation surface 98A of the sealing resin 98. The end surface 111B of the through electrode 111 is electrically connected to the second multilayer interconnection structure 117.

The through electrode 112 is provided in the through hole 102. The through electrode 112 has an end surface 112A connected to the connection surface 46A of the external connection pad 46 of the first semiconductor device 11. As a result, the through electrode 112 is electrically connected to the first semiconductor device 11.

The through electrode 112 has another end surface 112B in substantially the same plane as the electrode pad formation surfaces 95A and 96A of the second electronic components 95 and 96 and the multilayer interconnection structure formation surface 98A of the sealing resin 98. The end surface 112B of the through electrode 112 is electrically connected to the second multilayer interconnection structure 117.

The through electrode 113 is provided in the through hole 103. The through electrode 113 has an end surface 113A connected to the connection surface 44A of the external connection pad 44 of the first semiconductor device 11. As a result, the through electrode 113 is electrically connected to the first semiconductor device 11.

The through electrode 113 has another end surface 113B in substantially the same plane as the electrode pad formation surfaces 95A and 96A of the second electronic components 95 and 96 and the multilayer interconnection structure formation surface 98A of the sealing resin 98. The end surface 113B of the through electrode 113 is electrically connected to the second multilayer interconnection structure 117.

The through electrode 114 is provided in the through hole 104. The through electrode 114 has an end surface 114A connected to the connection surface 47A of the external connection pad 47 of the first semiconductor device 11. As a result, the through electrode 114 is electrically connected to the first semiconductor device 11.

The through electrode 114 has another end surface 114B in substantially the same plane as the electrode pad formation surfaces 95A and 96A of the second electronic components 95 and 96 and the multilayer interconnection structure formation surface 98A of the sealing resin 98. The end surface 114B of the through electrode 114 is electrically connected to the second multilayer interconnection structure 117.

The through electrodes 115 are provided in the corresponding through holes 105. The through electrodes 115 have respective end surfaces 115A connected to the connection surfaces 43A of the corresponding external connection pads 43 of the first semiconductor device 11. As a result, the through electrodes 115 are electrically connected to the first semiconductor device 11.

The through electrodes 115 have respective other end surfaces 115B in substantially the same plane as the electrode pad formation surfaces 95A and 96A of the second electronic components 95 and 96 and the multilayer interconnection structure formation surface 98A of the sealing resin 98. The end surfaces 115B of the through electrodes 115 are electrically connected to the second multilayer interconnection structure 117.

The through electrodes 111 through 115 configured as described above may be, for example, 200 μm in diameter. The through electrodes 111 through 115 may be, for example, 240 μm in height (vertical size). The through electrodes 111 through 115 may be formed by, for example, plating. Examples of the material of the through electrodes 111 through 115 include Cu.

The second multilayer interconnection structure 117 has substantially the same configuration as the first multilayer interconnection structure 25 of the first semiconductor device 11 except for additionally having a solder resist layer 128 on the configuration of the first multilayer interconnection structure 25. That is, the second multilayer interconnection structure 117 includes the layered body 41, which includes the insulating layers 56, 57, and 58, and the solder resist layer 128.

The second multilayer interconnection structure 117 is provided on the second electrode pads 121 through 124 and on the electrode pad formation surfaces 95A and 96A, the multilayer interconnection structure surface 98B, and the end surfaces 111B, 112B, 113B, 114B, and 115B of the through electrodes 111 through 115, which are in the same plane.

The connection surfaces 43A, 44A, 45A, 46A, and 47A of the external connection pads 43 through 47 (second pads) of the second multilayer interconnection structure 117 are to be connected to external connection terminals (not graphically illustrated) connected to a mounting board (not graphically illustrated) such as a motherboard when the electronic device 10 is mounted on the mounting board.

Here, a description is given of the connections of the interconnection patterns 51 through 54 (second interconnection patterns) of the second multilayer interconnection structure 117.

The interconnection pattern 51 is directly connected to (or in direct contact with) the connection surface 121A of the second electrode pad 121. As a result, the interconnection pattern 51 is electrically connected to the second electronic component 95. The interconnection pattern 51 has multiple connection surfaces 61A. The connection surfaces 61A of the interconnection pattern 51 are connected to the end surfaces 111B and 113B of the through electrodes 111 and 113, respectively. As a result, the interconnection pattern 51 is electrically connected to the first semiconductor device 11 through the through electrodes 111 and 113. The connection surface 66A of the interconnection pattern 51 is connected to the external connection pad 44. The interconnection pattern 51 electrically connects the external connection pad 44, the second electronic component 95, and the through electrodes 111 and 113.

The interconnection pattern 52 is directly connected to (or in direct contact with) the connection surfaces 122A and 123A of the second electrode pads 122 and 123, respectively. As a result, the interconnection pattern 52 is electrically connected to the second electronic components 95 and 96. The connection surface 74A of the interconnection pattern 52 is connected to the external connection pad 45. The connection surface 75A of the interconnection pattern 52 is connected to the external connection pad 46. The interconnection pattern 52 electrically connects the external connection pads 45 and 46 and the second electronic components 95 and 96.

The interconnection pattern 53 is directly connected to (or in direct contact with) the connection surface 124A of the second electrode pad 124. As a result, the interconnection pattern 53 is electrically connected to the second electronic component 96. The interconnection pattern 53 has multiple connection surfaces 77A. The connection surfaces 77A of the interconnection pattern 53 are connected to the end surfaces 112B and 114B of the through electrodes 112 and 114, respectively. As a result, the interconnection pattern 53 is electrically connected to the first semiconductor device 11 through the through electrodes 112 and 114. The connection surface 83A of the interconnection pattern 53 is connected to the external connection pad 47. The interconnection pattern 53 electrically connects the external connection pad 47, the second electronic component 96, and the through electrodes 112 and 114.

The connection surfaces 85A of the interconnection patterns 54 are connected to the end surfaces 115B of the corresponding through electrodes 115. As a result, the interconnection patterns 54 are electrically connected to the first semiconductor device 11 through the through electrodes 115. The connection surfaces 89A of the interconnection patterns 54 are connected to the corresponding external connection pads 43. The interconnection patterns 54 electrically connect the external connection pads 43 and the through electrodes 115.

Directly connecting the second electrode pads 121 through 124 of the second electronic components 95 and 96 with the interconnection patterns 51 through 53 (second interconnection patterns) as described above eliminates the necessity of bumps for electrically connecting the second electronic components 95 and 96 and the second multilayer interconnection structure 117. As a result, the second semiconductor device 12 is reduced in size in its thickness directions.

Further, the surface of the first semiconductor device 11 on the side on which the external connection pads 43 through 47 are formed is bonded to the adhesive layer 94 of the second semiconductor device 12 so that the external connection pads 43, the external connection pads 44 and 45, and the external connection pads 46 and 47 of the first semiconductor device 11 face the connection surfaces 85A, the connection surfaces 61A, and the connection surfaces 77A, respectively, of the second semiconductor device 12. Further, the through electrodes 115, the through electrodes 113 and 111, and the through electrodes 112 and 114 are provided through the parts of the adhesive layer 94 and the parts of the sealing resin 98 between the external connection pads 43 and the connection surfaces 85A, the external connection pads 44 and 45 and the connection surfaces 61A, and the external connection pads 46 and 47 and the connection surfaces 77A, respectively, to be connected to the external connection pads 43 and the connection surfaces 85A, the external connection pads 44 and 45 and the connection surfaces 61A, and the external connection pads 46 and 47 and the connection surfaces 77A, respectively. This makes it possible to electrically connect the first semiconductor device 11 and the second semiconductor device 12 without using internal connection terminals (such as solder balls) (that is, without providing a gap for providing internal connection terminals large [for example, 300 μm] in diameter between the first semiconductor device 11 and the second semiconductor device 12). Accordingly, the electronic device 10 is reduced in size in its thickness directions (vertical directions in FIGS. 2A and 2B).

Further, compared with the case of electrically connecting the first semiconductor device 11 and the second semiconductor device 12 using internal connection terminals (such as solder balls), it is possible to increase the reliability of the electrical connection between the first semiconductor device 11 and the second semiconductor device 12 by electrically connecting the first semiconductor device 11 and the second semiconductor device 12 through the through electrodes 111 through 115.

In addition, the electronic device 10 is formed by stacking the first semiconductor device 11, which includes the first multilayer interconnection structure 25 having the interconnection patterns 51 through 53 directly connected to the first electrode pads 31 through 34 of the first electronic components 15 and 16, and the second semiconductor device 12, which includes the second multilayer interconnection structure 117 having the interconnection patterns 51 through 53 directly connected to the second electrode pads 121 through 124 of the second electronic components 95 and 96. Accordingly, the electronic device 10 is reduced in size in its thickness directions.

The solder resist layer 128 is provided on the surface 58B of the insulating layer 58 of the second multilayer interconnection structure 117 so as to expose the connection surfaces 43A, 44A, 45A, 46A, and 47A of the external connection pads 43 through 47 of the second multilayer interconnection structure 117.

The second multilayer interconnection structure 117 configured as described above is smaller in thickness than the second electronic components 95 and 96 and the sealing resin 98. The second multilayer interconnection structure 117 may be, for example, 100 μm in thickness.

According to the electronic device 10 of this embodiment, the surface of the first semiconductor device 11 on the side on which the external connection pads 43 through 47 are formed is bonded to the adhesive layer 94 of the second semiconductor device 12 so that the external connection pads 43, the external connection pads 44 and 45, and the external connection pads 46 and 47 of the first semiconductor device 11 face the connection surfaces 85A, the connection surfaces 61A, and the connection surfaces 77A, respectively, of the second semiconductor device 12. Further, the through electrodes 115, the through electrodes 113 and 111, and the through electrodes 112 and 114 are provided through the parts of the adhesive layer 94 and the parts of the sealing resin 98 between the external connection pads 43 and the connection surfaces 85A, the external connection pads 44 and 45 and the connection surfaces 61A, and the external connection pads 46 and 47 and the connection surfaces 77A, respectively, to be connected to the external connection pads 43 and the connection surfaces 85A, the external connection pads 44 and 45 and the connection surfaces 61A, and the external connection pads 46 and 47 and the connection surfaces 77A, respectively. This makes it possible to electrically connect the first semiconductor device 11 and the second semiconductor device 12 without using internal connection terminals (such as solder balls). Accordingly, the electronic device 10 is reduced in size in its thickness directions.

Further, compared with the case of electrically connecting the first semiconductor device 11 and the second semiconductor device 12 using internal connection terminals (such as solder balls), it is possible to increase the reliability of the electrical connection between the first semiconductor device 11 and the second semiconductor device 12 by electrically connecting the first semiconductor device 11 and the second semiconductor device 12 through the through electrodes 111 through 115.

In addition, the electronic device 10 is formed by stacking the first semiconductor device 11, which includes the first multilayer interconnection structure 25 having the interconnection patterns 51 through 53 directly connected to the first electrode pads 31 through 34 of the first electronic components 15 and 16, and the second semiconductor device 12, which includes the second multilayer interconnection structure 117 having the interconnection patterns 51 through 53 directly connected to the second electrode pads 121 through 124 of the second electronic components 95 and 96. Accordingly, the electronic device 10 is reduced in size in its thickness directions.

Figure 3A:
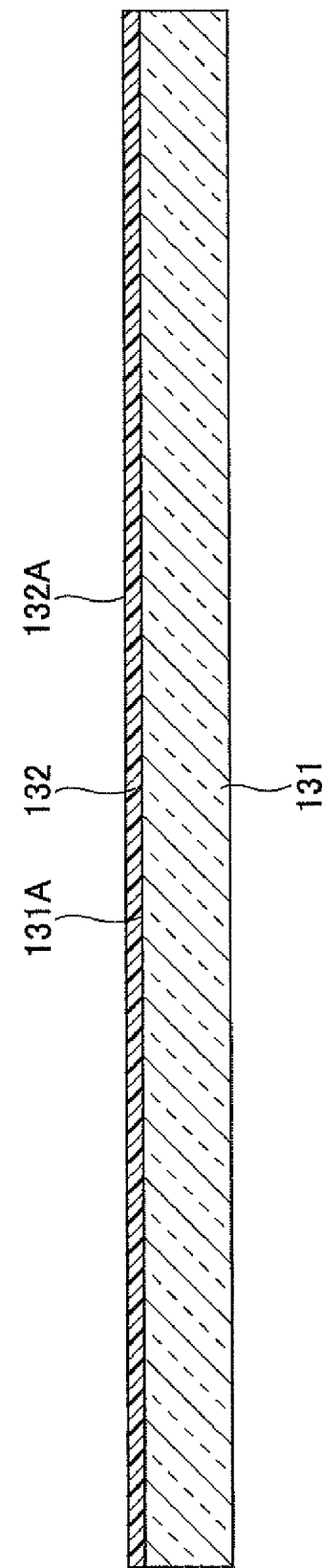
FIGS. 3A through 3U are diagrams illustrating a process for manufacturing an electronic device according to the first embodiment of the present invention.
Figure 3D:
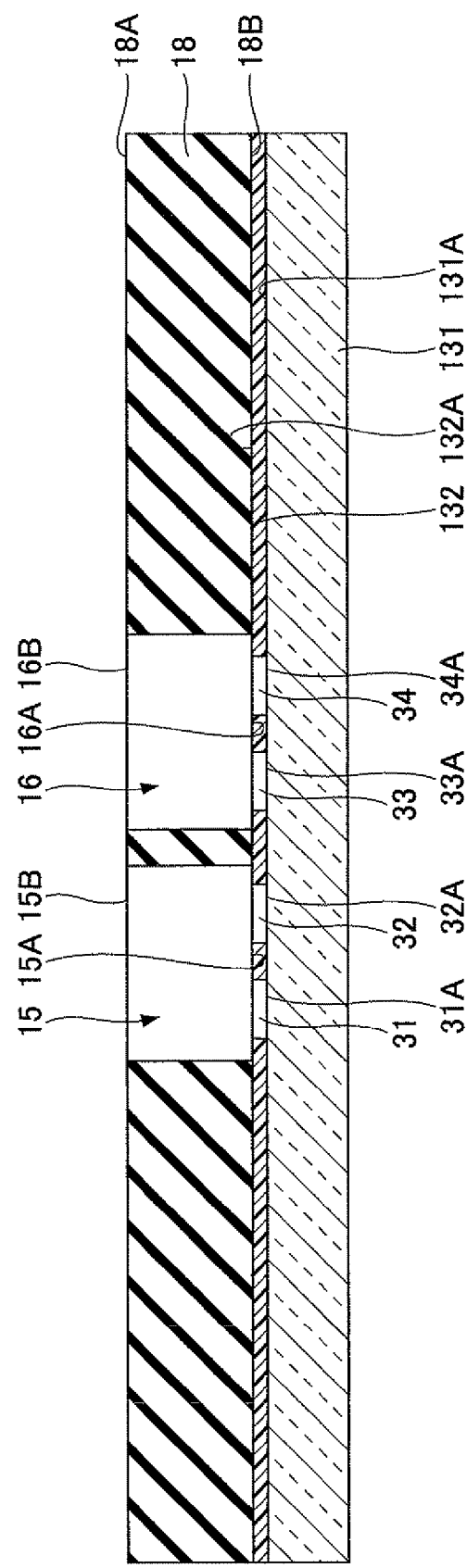
Figure 3E:
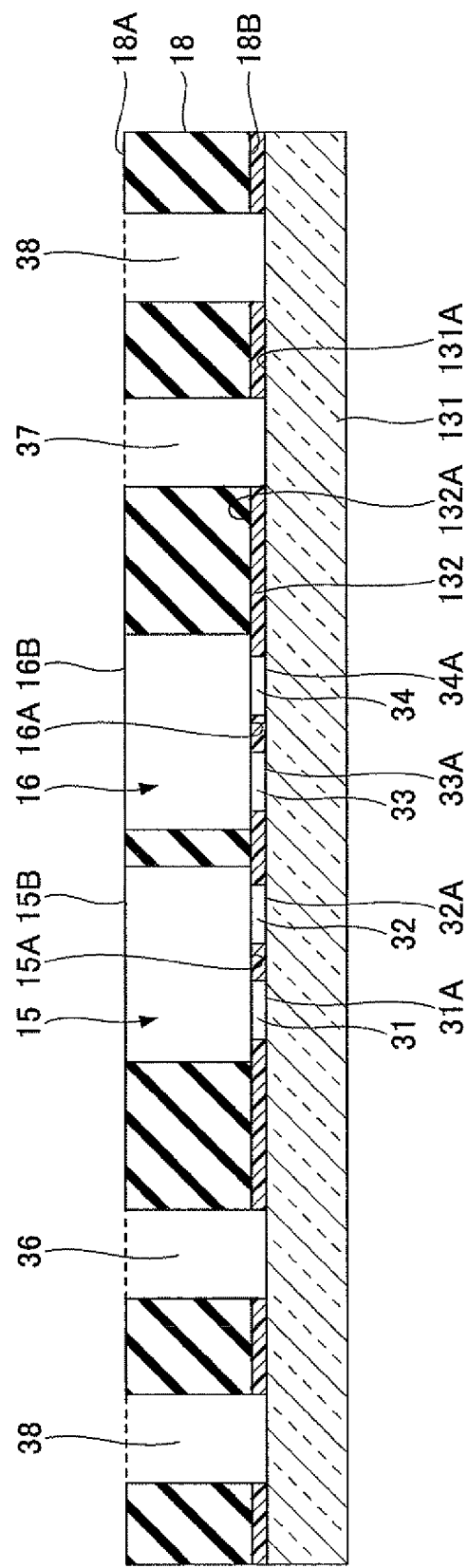
Figure 3F:
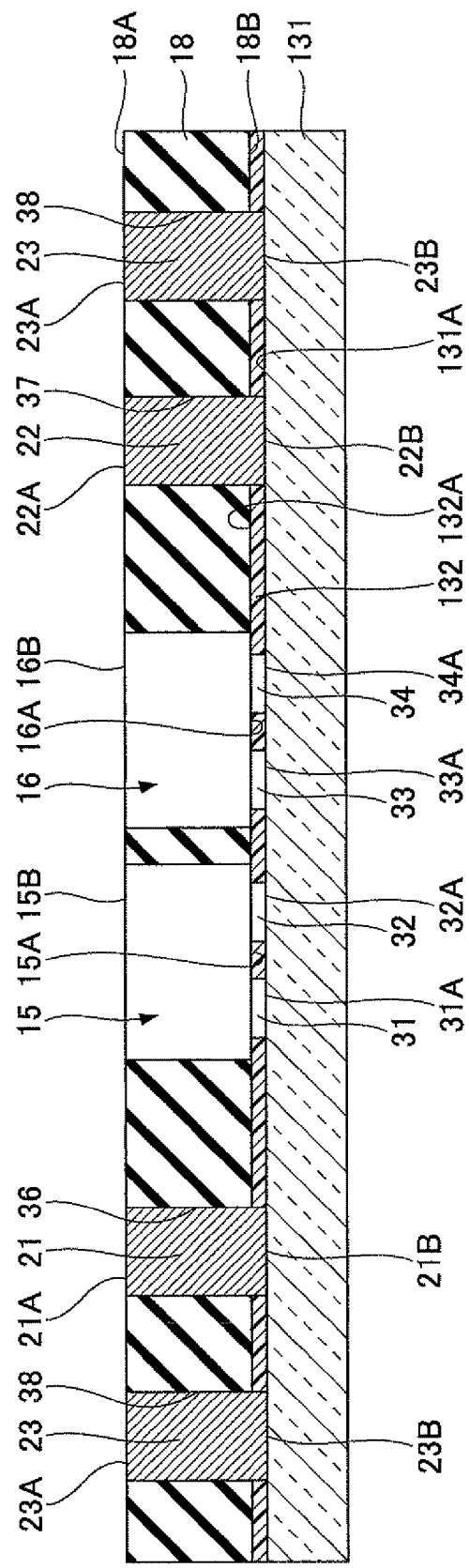
Figure 3G:
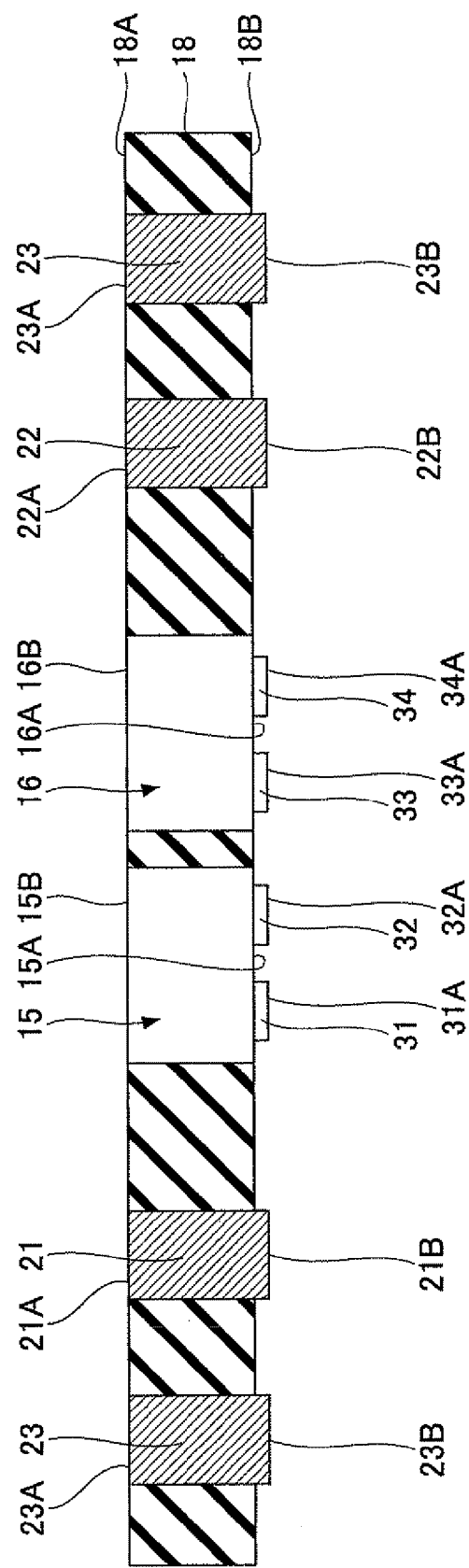
Figure 3H:
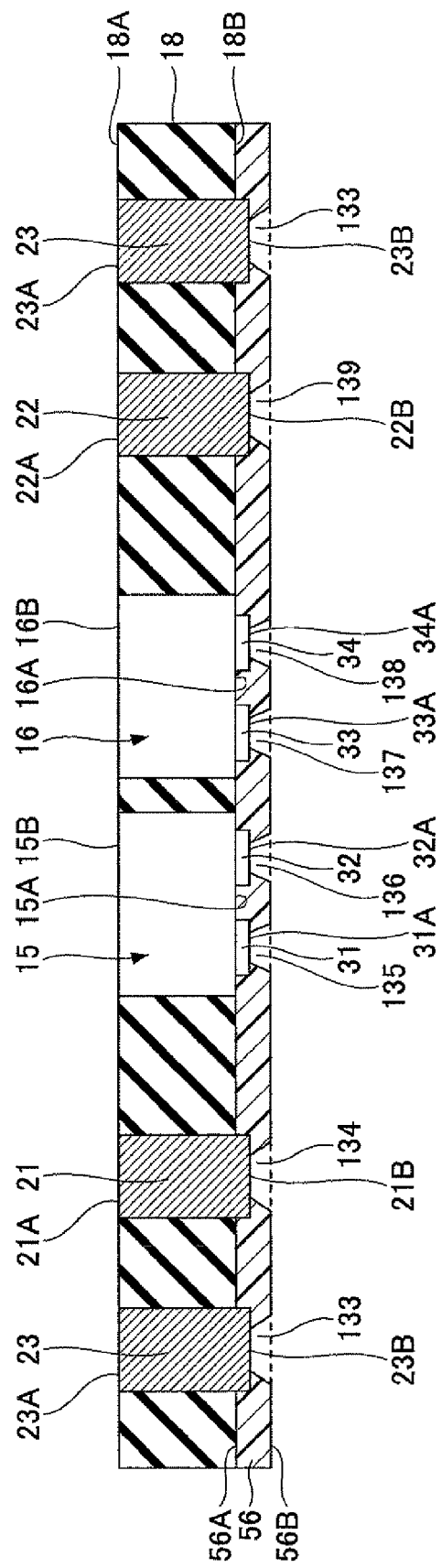
Figure 3I:
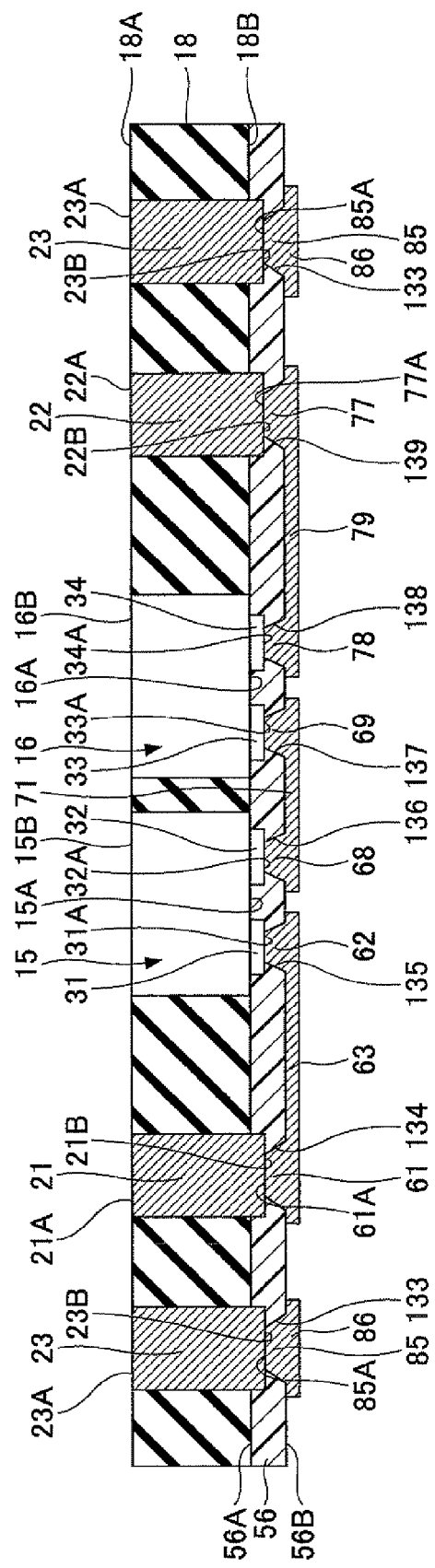
Figure 3J:
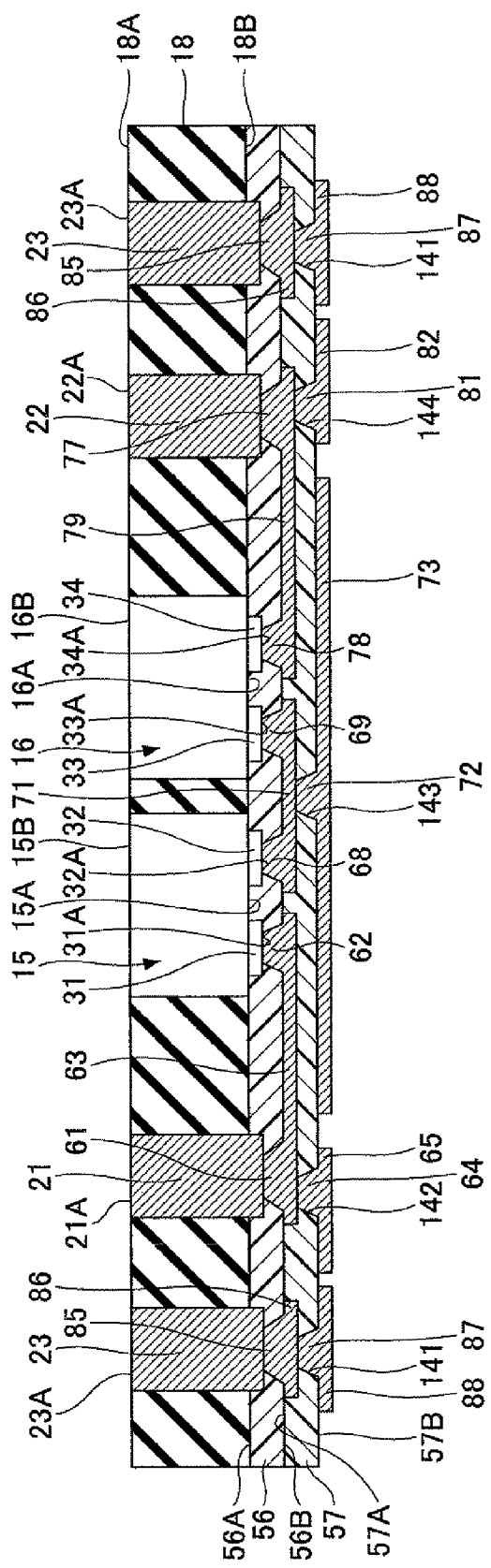
Figure 3K:
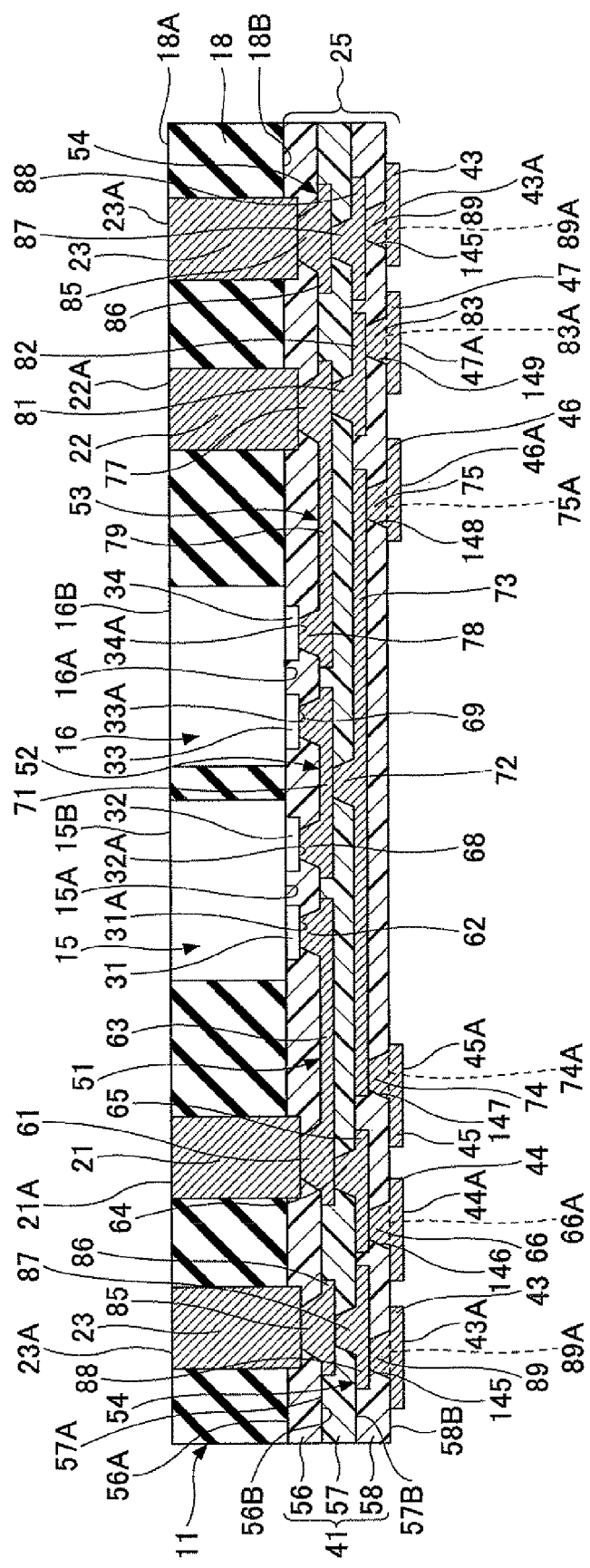
Figure 3L:
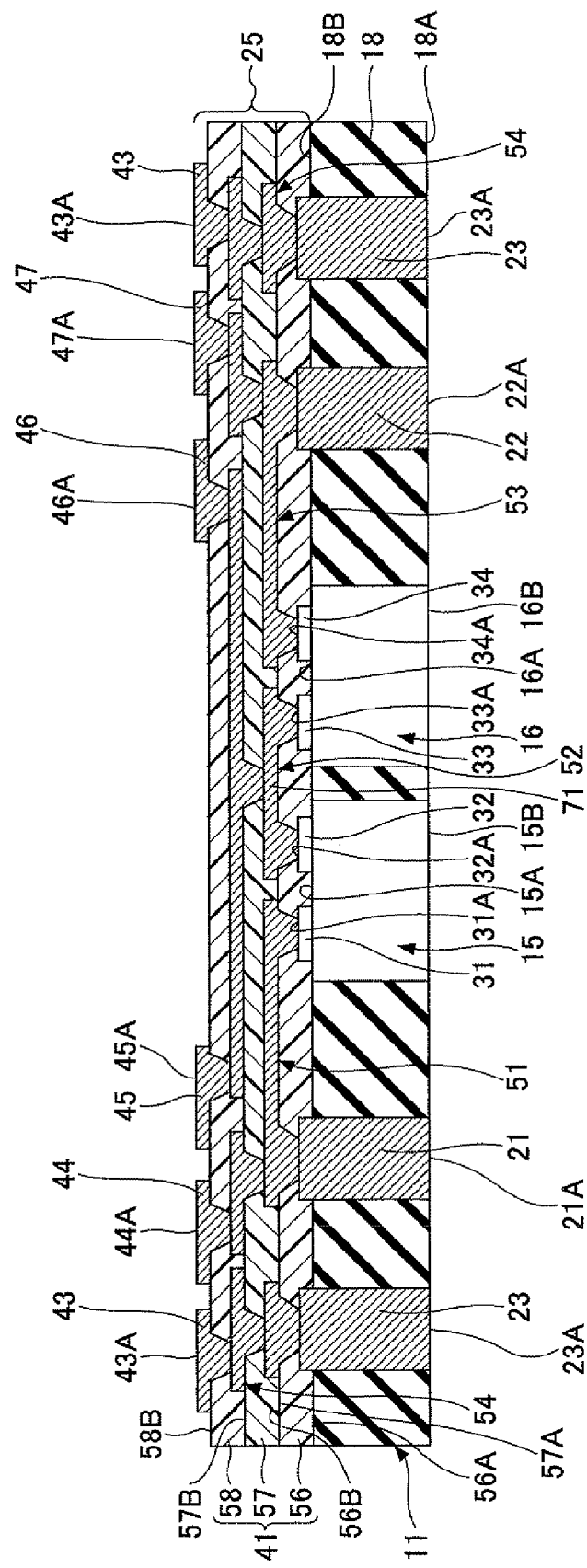
Figure 30:
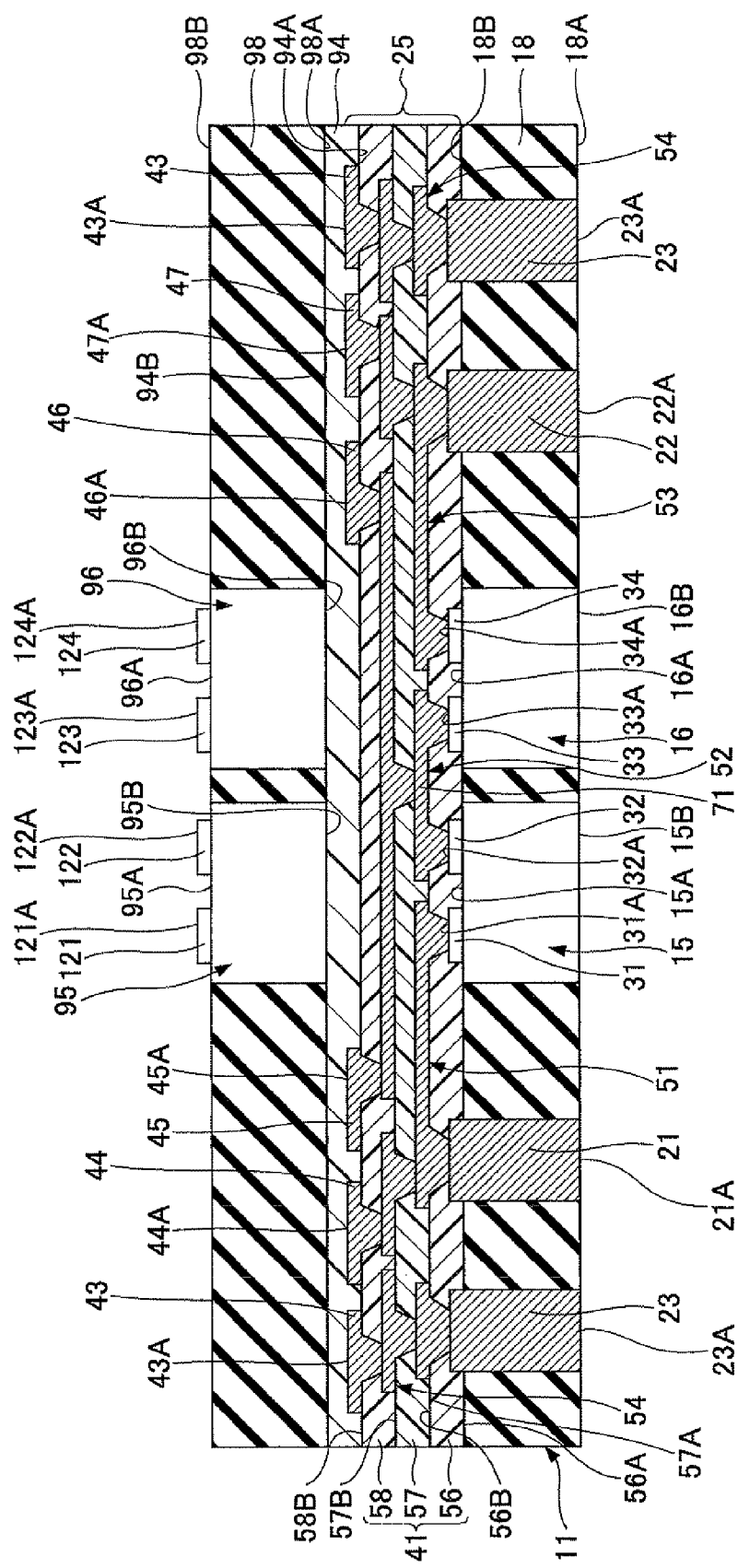
Figure 3P:
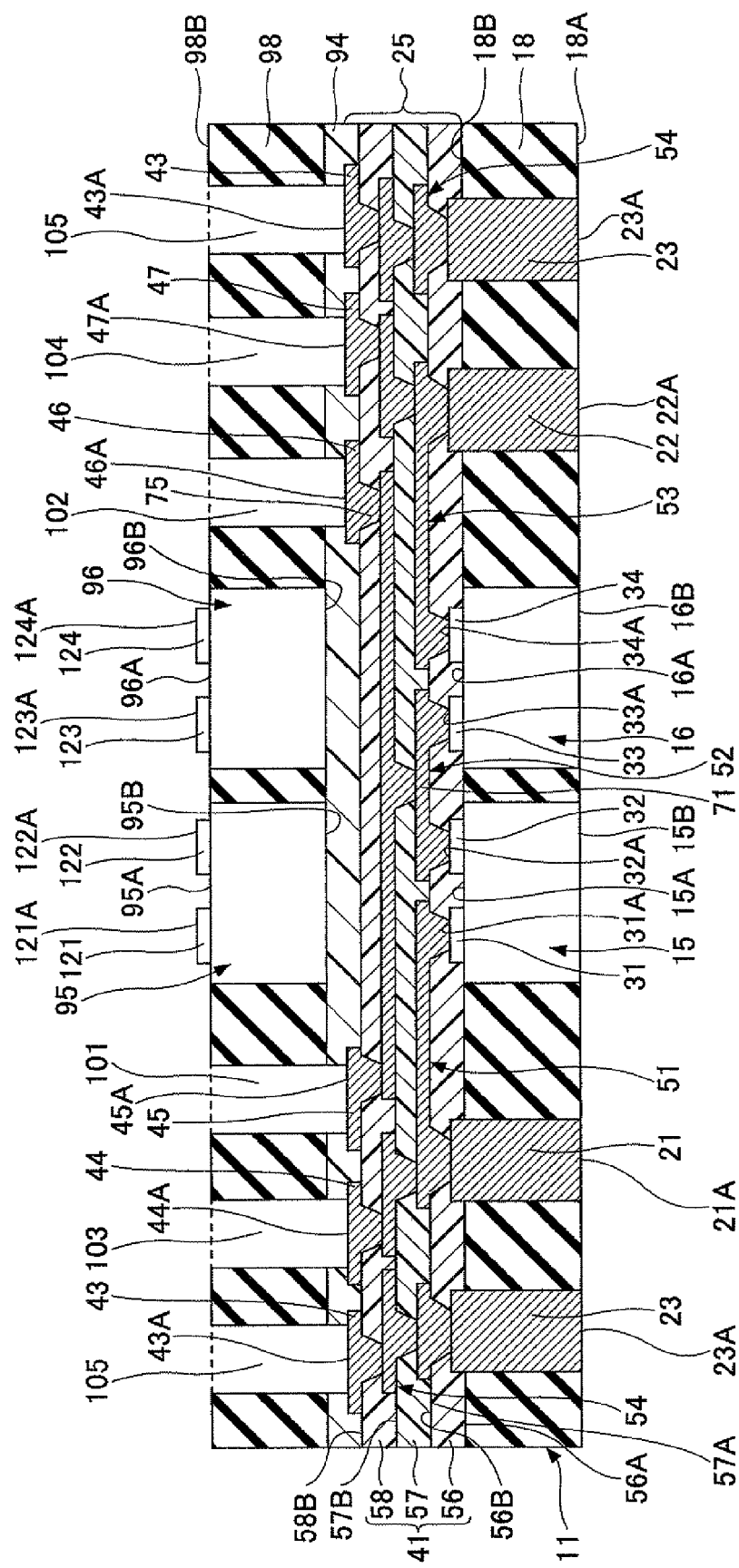
Figure 3Q:
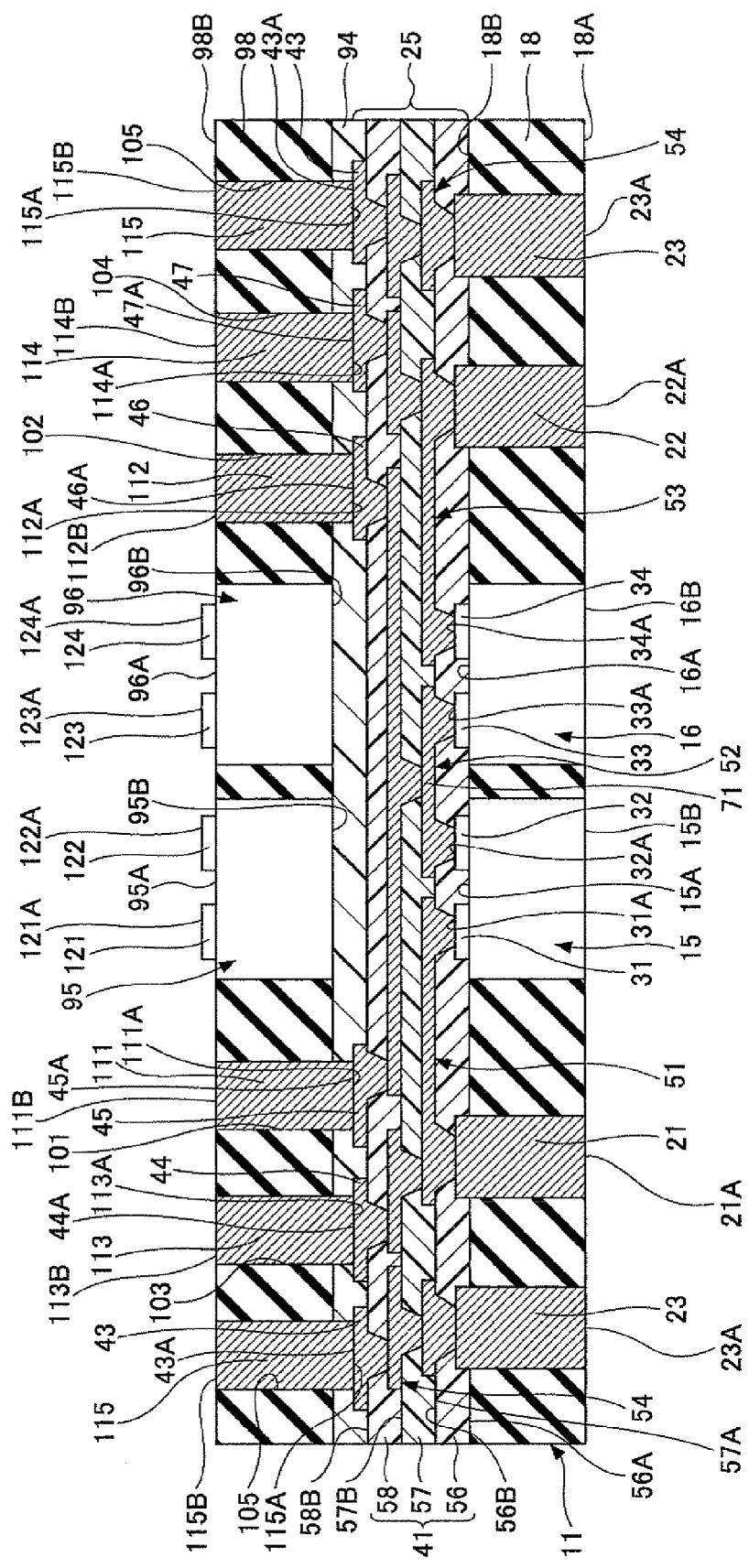
Figure 3R:
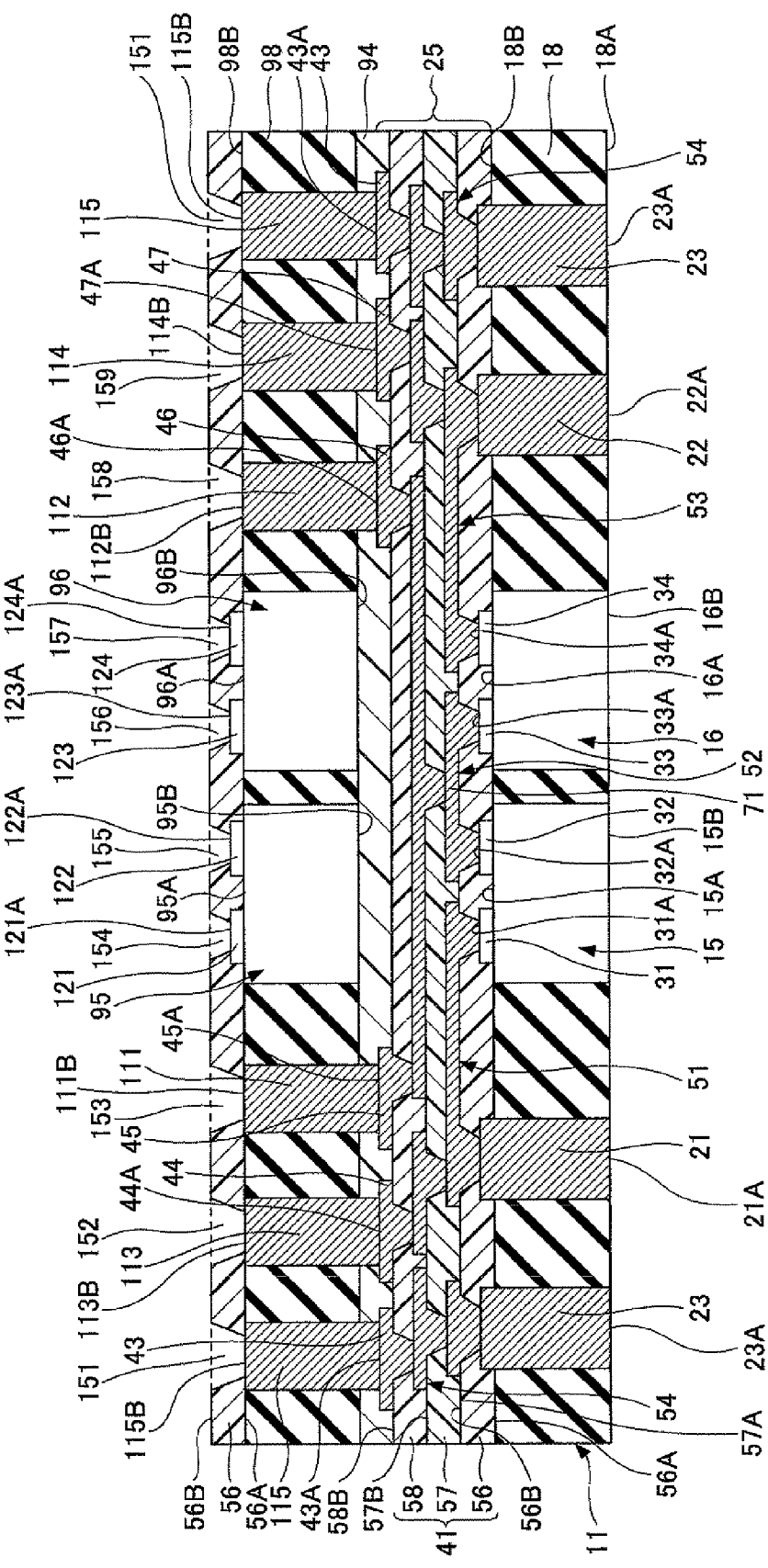
Figure 3S:
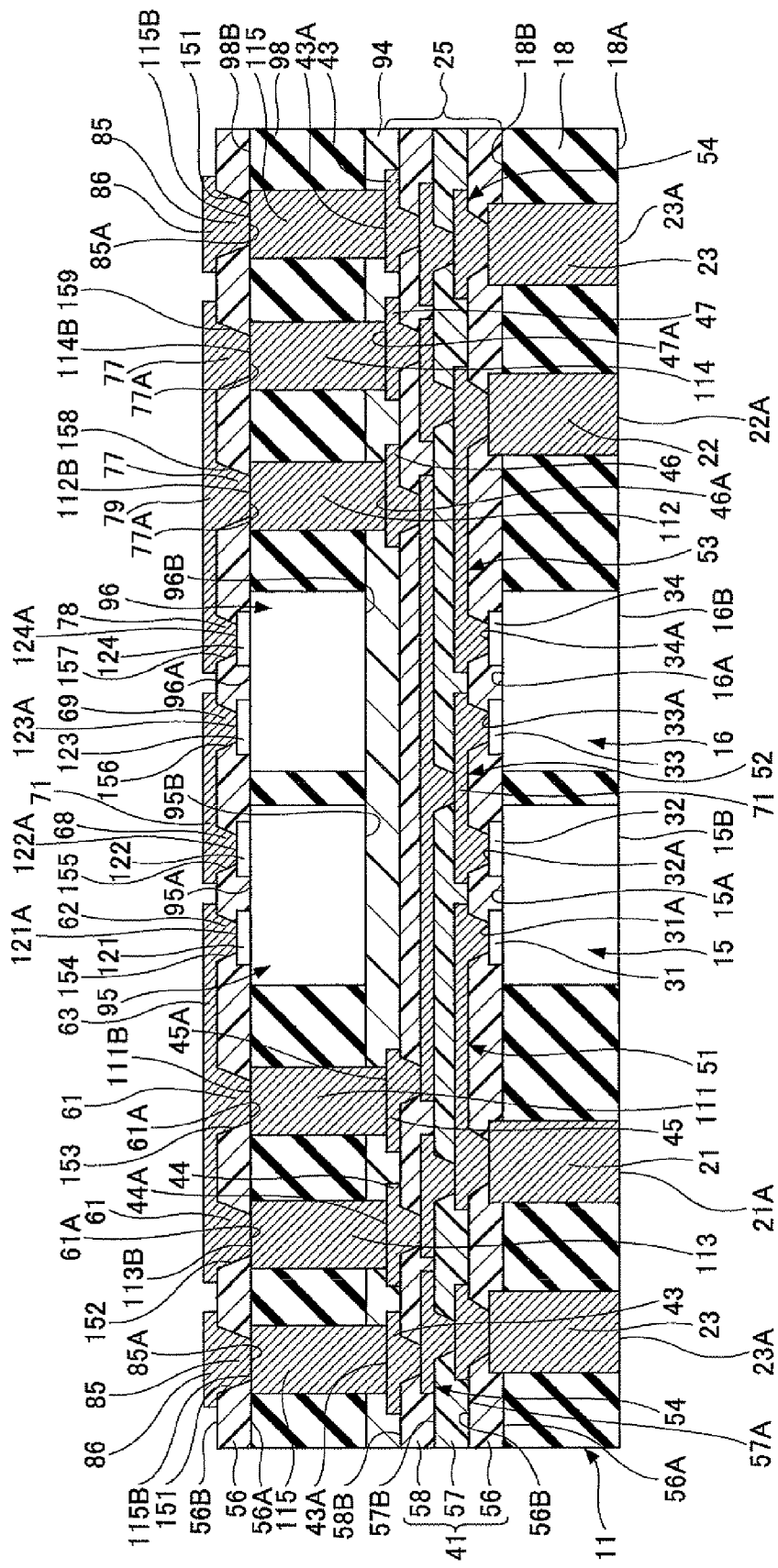
Figure 3T:
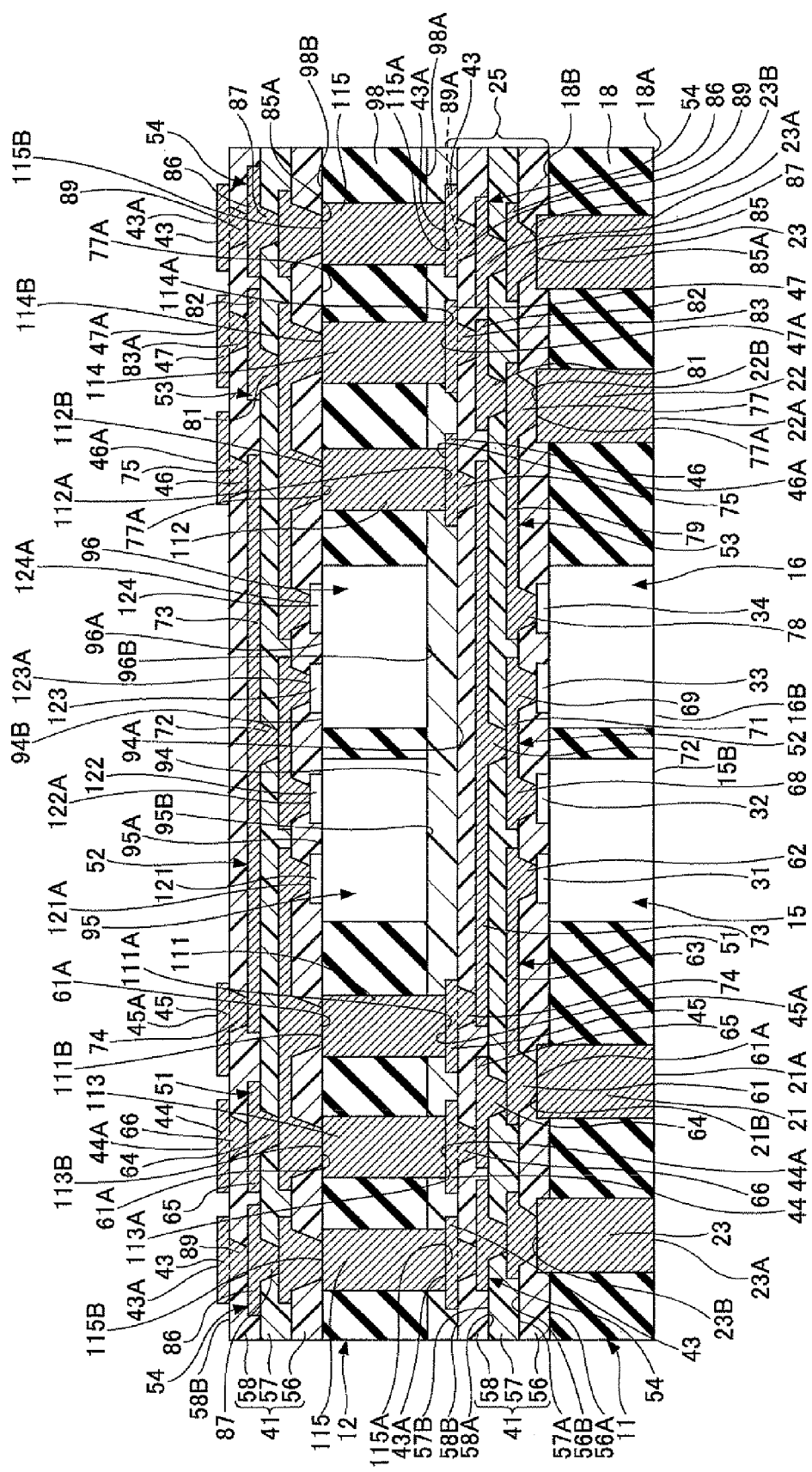
Figure 3U:
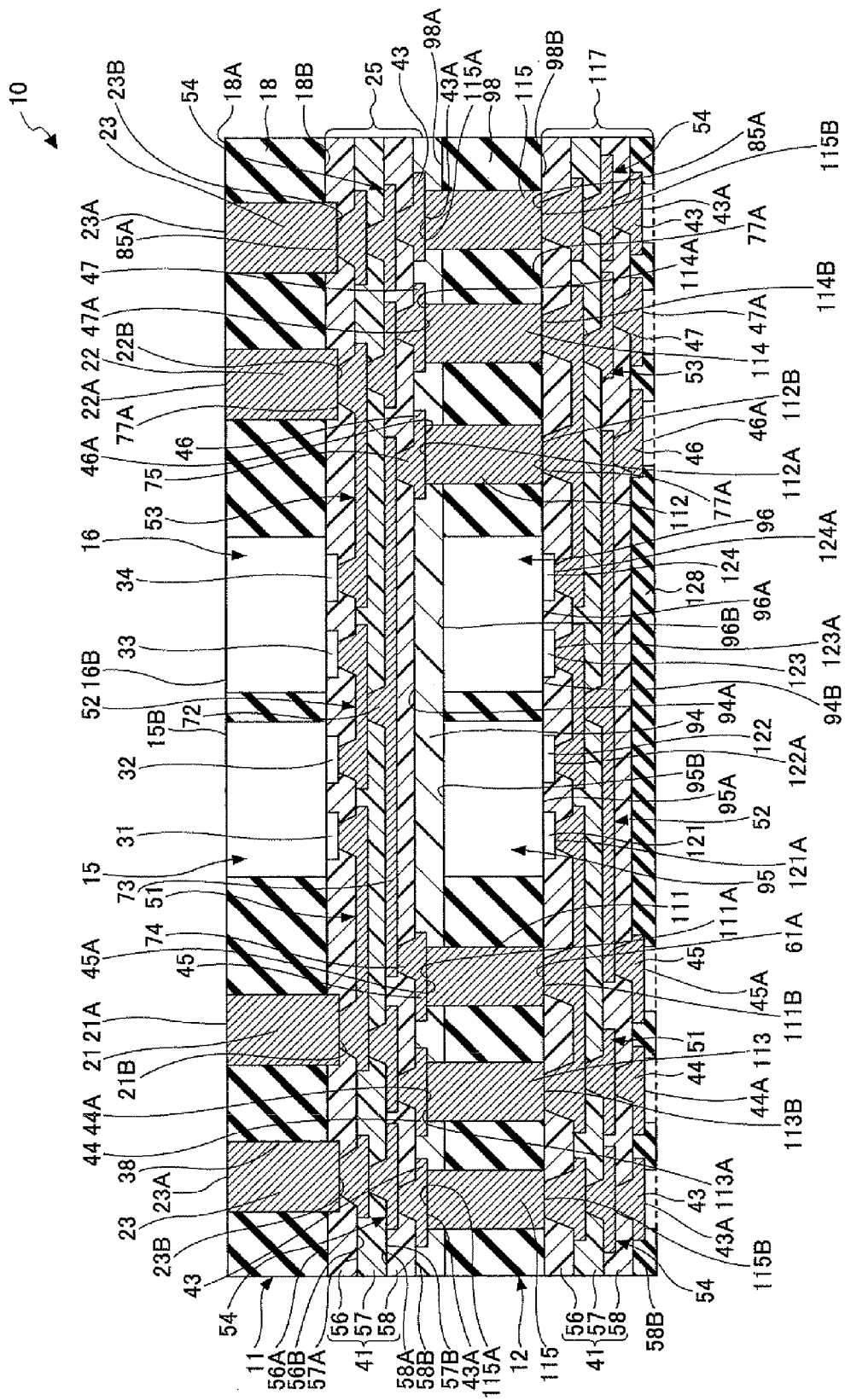

FIGS. 3A through 3U are diagrams illustrating a process for manufacturing an electronic device according to the first embodiment of the present invention. In FIGS. 3A through 3U, the same elements as those of the electronic device 10 of the first embodiment are referred to by the same reference numerals.

A description is given, with reference to FIGS. 3A through 3U, of a method of manufacturing the electronic device 10 of the first embodiment.

First, in the process illustrated in FIG. 3A, an adhesive agent 132 is formed (provided) on a surface 131A of a support body 131. Examples of the support body 131 include a glass substrate, a silicon substrate, and a metal plate (such as a Cu plate). The support body 131 may be, for example, 300 μm to 600 μm in thickness. Examples of the adhesive agent 132 include an adhesive polyimide resin tape (for example, 1 μm to 20 μm in thickness).

Next, in the process illustrated in FIG. 3B, the first electronic components 15 and 16 are bonded onto the support body 131 so that the connection surfaces 31A, 32A, 33A, and 34A of the first electrode pads 31 through 34 come into contact with the surface 131A of the support body 131 and the electrode pad formation surfaces 15A and 16A of the first electronic components 15 and 16 are covered with the adhesive agent 132.

At this stage, the first electronic components 15 and 16 do not have a thin plate shape (that is, not thinned). The first electronic components 15 and 16 at this stage, which are not thinned, are easier to handle than the first electronic components 15 and 16 shaped into thin plates. Accordingly, it is possible to bond the first electronic components 15 and 16 to predetermined positions on the support body 131 with accuracy. The first electronic components 15 and 16 at this stage, that is, before being subjected to thinning, may be, for example, 700 μm in thickness.

The first electronic components 15 and 16 may be, for example, semiconductor chips. By way of example, the first electronic components 15 and 16 may be semiconductor chips for CPUs (Central Processing Units); one of the first electronic components 15 and 16 may be a semiconductor chip for a CPU and the other one of the first electronic components 15 and 16 may be a semiconductor chip for a memory; or one of the first electronic components 15 and 16 may be a semiconductor chip for a CPU and the other one of the first electronic components 15 and 16 may be a semiconductor chip for a GPU (Graphics Processing Unit).

Next, in the process illustrated in FIG. 3C, the sealing resin 18 is formed (provided) on a surface 132A of the adhesive agent 132, which surface 132A is on the side opposite to the surface of the adhesive agent 132 in contact with the support body 131, so as to seal parts of the side surfaces of the first electronic components 15 and 16.

The sealing resin 18 may be, for example, molded resin, which may be formed of, for example, epoxy resin. The sealing resin 18 may be formed by transfer molding. The sealing resin 18 is formed to have its upper surface positioned higher than the rear surfaces 15B and 16B of the first electronic components 15 and 16 after a thinning process. At this stage, the sealing resin 18 may be, for example, 300 μm in thickness.

Next, in the process illustrated in FIG. 3D, the first electronic components 15 and 16 and the sealing resin 18 are ground from the upper surface side of the structure illustrated in FIG. 3C (the side of the rear surfaces 15B and 16B of the first electronic components 15 and 16) (using, for example, a backside grinder), thereby thinning the first electronic components 15 and 16 so that the rear surfaces 15B and 16B of the thinned first electronic components 15 and 16 and the surface 18A of the ground sealing resin 18 are in the same plane.

As a result, the structure illustrated in FIG. 3D has a flat upper surface. The first electronic components 15 and 16 (parts of the first electronic components 15 and 16 on the adhesive agent 132) after thinning may be, for example, 200 μm in thickness. In this case, the sealing resin 18 after grinding may be, for example, 200 μm in thickness.

Next, in the process illustrated in FIG. 3E, the through holes 36 through 38 are formed through the sealing resin 18 and the adhesive agent 132 from the surface 18A side of the sealing resin 18.

The through holes 36 through 38 are formed by exposing parts of the sealing resin 18 and the adhesive agent corresponding to (regions) where the through holes 36 through 38 are to be formed to laser light, for example. The through holes 36 through 38 are formed to expose the surface 131A of the support body 131. The through holes 36 through 38 may be, for example, 200 μm in diameter.

Next, in the process illustrated in FIG. 3F, the through electrode 21, the through electrode 22, and the through electrodes 23 are simultaneously formed to fill in the through hole 36, the through hole 37, and the through holes 38, respectively. As a result, the end surfaces 21B, 22B, and 23B of the through electrodes 21 through 23 are formed in the same plane as the connection surfaces 31A, 32A, 33A, and 34A of the first electrode pads 31 through 34.

At this point, the through electrodes 21 through 23 are formed so as to have their respective end surfaces 21A, 22A, and 23A positioned in the same plane as the rear surfaces 15B and 16B of the first electronic components 15 and 16 and the surface 18A of the sealing resin 18. The through electrodes 21 through 23 may be formed by, for example, plating or printing.

In the case of using printing, a Cu layer may be formed on the surface 131A of the support body 131 (such as, a silicon substrate or a glass substrate) by sputtering. The Cu layer serves as a power feeding layer in the case of a silicon substrate or a glass substrate. Thereafter, the Cu layer is fed with electricity to cause a plate film to be deposited and grow to fill in the through holes 36 through 38. Thereby, the through electrodes 21 through 23 are formed. Examples of the material of the through electrodes 21 through 23 include Cu.

In the case of using a metal plate (such as a Cu plate) as the support body 131, the support body 131 serves as a power feeding layer. Accordingly, there is no need to form the above-described Cu layer. The through electrodes 21 through 23 may be, for example, 200 μm in diameter.

After formation of the through electrodes 21 through 23, a protection layer (such as a Ni/Au layered film of alternate layers of Ni-plating and Au-plating) may be provided on the end surfaces 21A, 22A, and 23A of the through electrodes 21 through 23.

Next, in the process illustrated in FIG. 3G, the adhesive agent 132 and the support body 131 are removed from the first electronic components 15 and 16 and the sealing resin 18 in which the through electrodes 21 through 23 are formed as illustrated in FIG. 3F.

For example, the support body 131 is mechanically separated from the first electronic components 15 and 16 and the sealing resin 18 in which the through electrodes 21 through 23 are formed as illustrated in FIG. 3F, thereby removing the support body 131 and the adhesive agent 132 together. As a result, the through electrodes 21 through 23 and the first electrode pads 31 through 34 project relative to the multilayer interconnection structure formation surface 18B of the sealing resin 18 by the thickness of the adhesive agent 132. However, such projecting to some extent does not cause a problem in the manufacturing process. Further, the end surfaces 21B, 22B, and 23B of the through electrodes 21 through 23 and the connection surfaces 31A, 32A, 33A, and 34A of the first electrode pads 31 through 34 are not incompletely the same plane as the multilayer interconnection structure formation surface 18B of the sealing resin 18.

Next, in the process illustrated in FIG. 3H, the insulating layer 56 having openings 133, 134, 135, 136, 137, 138, and 139 is formed on the multilayer interconnection structure formation surface 18B of the sealing resin 18, the first electrode pads 31 through 34, the electrode pad formation surfaces 15A and 16A of the first electronic components 15 and 16, and the end surfaces 21B, 22B, and 23B of the through electrodes 21 through 23.

For example, the insulating layer 56 is formed by sticking an insulating resin film (such as an epoxy resin film) serving as the base material of the insulating layer 56 to the lower surface of the structure illustrated in FIG. 3G and thereafter performing laser processing on parts of the insulating resin film corresponding to the openings 133 through 139. The insulating layer 56 may be, for example, 5 μm to 30 μm in thickness.

The openings 133 are formed so as to expose the end surfaces 23B of the through electrodes 23. The opening 134 is formed so as to expose the end surface 21B of the through electrode 21. The opening 135 is formed so as to expose the connection surface 31A of the first electrode pad 31. The opening 136 is formed so as to expose the connection surface 32A of the first electrode pad 32. The opening 137 is formed so as to expose the connection surface 33A of the first electrode pad 33. The opening 138 is formed so as to expose the connection surface 34A of the first electrode pad 34. The opening 139 is formed so as to expose the end surface 22B of the through electrode 22.

Next, in the process illustrated in FIG. 3I, the vias 61, 62, 68, 69, 77, 78, and 85 are formed in the openings 134, 135, 136, 137, 139, 138, and 133, respectively, and the interconnects 63, 71, 79, and 86 are formed on the surface 56B of the insulating layer 56 at the same time.

The via 61 is formed in the opening 134 so that the connection surface 61A connects to the end surface 218 of the through electrode 21. The via 62 is formed in the opening 135 so as to connect to the connection surface 31A of the first electrode pad 31. The via 68 is formed in the opening 136 so as to connect to the connection surface 32A of the first electrode pad 32. The via 69 is formed in the opening 137 so as to connect to the connection surface 33A of the first electrode pad 33. The via 77 is formed in the opening 139 so that the connection surface 77A connects to the end surface 22B of the through electrode 22. The via 78 is formed in the opening 138 so as to connect to the connection surface 34A of the first electrode pad 34. The vies 85 are formed in the corresponding openings 133 so that the connection surfaces 85A connect to the end surfaces 23B of the corresponding through electrodes 23.

The interconnect 63 is formed on the surface 56B of the insulating layer 56 as part of a unitary structure with the vies 61 and 62. The interconnect 71 is formed on the surface 56B of the insulating layer 56 as part of a unitary structure with the vias 68 and 69. The interconnect 79 is formed on the surface 56B of the insulating layer 56 as part of a unitary structure with the vias 77 and 78. The interconnects 86 are formed on the surface 56B of the insulating layer 56 as parts of respective unitary structures with the corresponding vias 85.

As a result, the first electrode pads 31 and 32 of the first electronic component 15 are directly connected to (or in direct contact with) the vias 62 and 68, respectively, and the first electrode pads 33 and 34 of the first electronic component 16 are directly connected to (or in direct contact with) the vias 69 and 78, respectively.

By thus connecting the first electrode pads 31 through 34 of the first electronic components 15 and 16 directly to the vias 62, 68, 69, and 78, it is possible to electrically connect the first electronic components 15 and 16 and the first multilayer interconnection structure 25 without using bumps or metal wires. Accordingly, the first semiconductor device 11 is reduced in size in its thickness directions.

The vias 61, 62, 68, 69, 77, 78, and 85 and the interconnects 63, 71, 79, and 86 may be formed by, for example, a semi-additive process. Examples of the material of the vias 61, 62, 68, 69, 77, 78, and 85 and the interconnects 63, 71, 79, and 86 include Cu.

Next, in the process illustrated in FIG. 3J, the insulating layer 57 having openings 141, 142, 143, and 144 is formed on the surface 56B of the insulating layer 56 by performing the same processing as in the above-described process illustrated in FIG. 3H.

The openings 141 are formed so as to expose parts of the corresponding interconnects 86. The opening 142 is formed so as to expose part of the interconnect 63. The opening 143 is formed so as to expose part of the interconnect 71. The opening 144 is formed so as to expose part of the interconnect 79. Examples of the material of the insulating layer 57 include an epoxy resin film. The insulating layer 57 may be, for example, 5 μm to 30 μm in thickness.

Next, the vias 64, 72, 81, and 87 are formed in the openings 142, 143, 144, and 141, respectively, and the interconnects 65, 73, 82, and 88 are formed on the surface 57B of the insulating layer 57 at the same time by performing the same processing as in the above-described process illustrated in FIG. 3I.

The via 64 is formed in the opening 142 so as to connect to the interconnect 63. The via 72 is formed in the opening 143 so as to connect to the interconnect 71. The via 81 is formed in the opening 144 so as to connect to the interconnect 79. The vias 87 are formed in the corresponding openings 141 so as to connect to the corresponding interconnects 86.

The interconnect 65 is formed on the surface 57B of the insulating layer 57 as part of a unitary structure with the via 64. The interconnect 73 is formed on the surface 57B of the insulating layer 57 as part of a unitary structure with the via 72. The interconnect 82 is formed on the surface 57B of the insulating layer 57 as part of a unitary structure with the via 81. The interconnects 88 are formed on the surface 57B of the insulating layer 57 as parts of respective unitary structures with the corresponding vias 87.

The vias 64, 72, 81, and 87 and the interconnects 65, 73, 82, and 88 may be formed by, for example, a semi-additive process. Examples of the material of the vias 64, 72, 81, and 87 and the interconnects 65, 73, 82, and 88 include Cu.

Next, in the process illustrated in FIG. 3K, the insulating layer 58 having openings 145, 146, 147, 148, and 149 is formed on the surface 57B of the insulating layer 57 by performing the same processing as in the above-described process illustrated in FIG. 3H.

The openings 145 are formed so as to expose parts of the corresponding interconnects 88. The opening 146 is formed so as to expose part of the interconnect 65. The opening 147 is formed so as to expose part of the interconnect 73. The opening 148 is formed so as to expose part of the interconnect 73. The opening 149 is formed so as to expose part of the interconnect 82. Examples of the material of the insulating layer 58 include an epoxy resin film. The insulating layer 58 may be, for example, 5 μm to 30 μm in thickness.

Next, the vias 66, 74, 75, 83, and 89 are formed in the openings 146, 147, 148, 149, and 145, respectively, and the external connection pads 43 through 47 are formed on the surface 58B of the insulating layer 58 at the same time by performing the same processing as in the above-described process illustrated in FIG. 3I. As a result, the interconnection patterns 51 through 54 and the first multilayer interconnection structure 25 are formed, and the first semiconductor device 11 including the interconnection patterns 51 through 54 and the first multilayer interconnection structure 25 is manufactured. The processes illustrated in FIGS. 3A through 3K may be referred to as a first semiconductor device forming step.

The via 66 is formed in the opening 146 so as to connect to the interconnect 65. The via 74 is formed in the opening 147 so as to connect to the interconnect 73. The via 75 is formed in the opening 148 so as to connect to the interconnect 73. The via 83 is formed in the opening 149 so as to connect to the interconnect 82. The vias 89 are formed in the corresponding openings 145 so as to connect to the corresponding interconnects 88.

The external connection pads 43 are formed on the surface 58B of the insulating layer 58 as parts of respective unitary structures with (the connection surfaces 89A of) the corresponding vias 89. The external connection pad 44 is formed on the surface 58B of the insulating layer 58 as part of a unitary structure with (the connection surface 66A) of the via 66. The external connection pad 45 is formed on the surface 58B of the insulating layer 58 as part of a unitary structure with (the connection surface 74A) of the via 74. The external connection pad 46 is formed on the surface 58B of the insulating layer 58 as part of a unitary structure with (the connection surface 75A) of the via 75. The external connection pad 47 is formed on the surface 58B of the insulating layer 58 as part of a unitary structure with (the connection surface 83A) of the via 83.

The vias 66, 74, 75, 83, and 89 and the external connection pads 43 through 47 may be formed by, for example, a semi-additive process. Examples of the material of the vias 66, 74, 75, 83, and 89 and the external connection pads 43 through 47 include Cu.

Next, in the process illustrated in FIG. 3L, the first semiconductor device 11 illustrated in FIG. 3K is turned upside down.

Next, in the process illustrated in FIG. 3M, the second electronic components 95 and 96 are prepared. The second electronic component 95 includes the second electrode pads 121 and 122 having their respective connection surfaces 121A and 122A, the electrode pad formation surface 95A on which the second electrode pads 121 and 122 are formed, and the rear surface 95B. The second electronic component 96 includes the second electrode pads 123 and 124 having their respective connection surfaces 123A and 124A, the electrode pad formation surface 96A on which the second electrode pads 123 and 124 are formed, and the rear surface 96B. Thereafter, the electronic component placement surface 94B of the adhesive layer 94 and the rear surfaces 95B and 96B of the second electronic components 95 and 96 are bonded. (This process may be referred to as a second electronic component bonding process.)

Examples of the adhesive layer 94 include an epoxy resin film. In this case, the adhesive layer 94 may be, for example, 50 μm in thickness.

The second electronic components 95 and 96 have a thin plate shape and may be, for example, 200 μm in thickness. The second electronic components 95 and 96 may be, for example, semiconductor chips. By way of example, the second electronic components 95 and 96 may be semiconductor chips for CPUs (Central Processing Units); one of the second electronic components 95 and 96 may be a semiconductor chip for a CPU and the other one of the first electronic components 95 and 96 may be a semiconductor chip for a memory; or one of the first electronic components 95 and 96 may be a semiconductor chip for a CPU and the other one of the first electronic components 95 and 96 may be a semiconductor chip for a GPU (Graphics Processing Unit).

Next, in the process illustrated in FIG. 3N, the sealing resin 98 is formed on the electronic component placement surface 94B of the adhesive layer 94. (This process may be referred to as a sealing resin forming process.) The sealing resin 98 has the multilayer interconnection structure formation surface 98S that exposes the second electrode pads 121 through 124 and the electrode pad formation surfaces 95A and 96A, and seals the side surfaces of the second electronic components 95 and 96.

The sealing resin 98 may be, for example, molded resin, whose material may be, for example, epoxy resin. The sealing resin 98 may be formed by transfer molding. The sealing resin 98 may be, for example, 200 μm in thickness.

Next, in the process illustrated in FIG. 3O, the structure illustrated in FIG. 3N is stuck onto the first semiconductor device 11 illustrated in FIG. 3L, so that the surface 94A of the adhesive layer 94 provided in the structure illustrated in FIG. 3N covers the surface 58A of the insulating layer 58 and the external connection pads 43 through 47 of the first semiconductor device 11. (This process may be referred to as an adhesive layer sticking process.)

Next, in the process illustrated in FIG. 3P, the through holes 101 through 105 are formed through parts of the adhesive layer 94 and the sealing resin 98 which parts face the connection surfaces 45A, 46A, 44A, 47A, and 43A of the external connection pads 45, 46, 44, 47, and 43, respectively.

The through hole 101 is formed so as to expose the connection surface 45A. The through hole 102 is formed so as to expose the connection surface 46A. The through hole 103 is formed so as to expose the connection surface 44A. The through hole 104 is formed so as to expose the connection surface 47A. The through holes 105 are formed so as to expose the corresponding connection surfaces 43A.

The through holes 101 through 105 may be formed by performing laser processing on parts of the adhesive layer 94 and the sealing resin 98 which parts correspond to (regions) where the through holes 101 through 105 are to be formed. The through holes 101 through 105 may be, for example, 200 μm in diameter.

Next, in the process illustrated in FIG. 3Q, the through electrodes 111 through 115 are formed to fill in the through holes 101 through 105, respectively, by the same technique as in the above-described process illustrated in FIG. 3F. Examples of the material of the through electrodes 111 through 115 include Cu.

The through electrode 111 is formed in the through hole 101 so as to have the end surface 111A connected to the connection surface 45A and to have the end surface 111B in substantially the same plane as the electrode pad formation surfaces 95A and 96A and the surface 98B of the sealing resin 98.

The through electrode 112 is formed in the through hole 102 so as to have the end surface 112A connected to the connection surface 46A and to have the end surface 112B in substantially the same plane as the electrode pad formation surfaces 95A and 96A and the surface 98B of the sealing resin 98.

The through electrode 113 is formed in the through hole 103 so as to have the end surface 113A connected to the connection surface 44A and to have the end surface 113B in substantially the same plane as the electrode pad formation surfaces 95A and 96A and the surface 98B of the sealing resin 98.

The through electrode 114 is formed in the through hole 104 so as to have the end surface 114A connected to the connection surface 47A and to have the end surface 114B in substantially the same plane as the electrode pad formation surfaces 95A and 96A and the surface 98B of the sealing resin 98.

The through electrodes 115 are formed in the corresponding through holes 105 so as to have the end surfaces 115A connected to the corresponding connection surfaces 43A and to have the end surfaces 115B in substantially the same plane as the electrode pad formation surfaces 95A and 96A and the surface 98B of the sealing resin 98.

Next, in the process illustrated in FIG. 3R, the insulating layer 56 having openings 151, 152, 153, 154, 155, 156, 157, 158, and 159 is formed on the multilayer interconnection structure formation surface 98B and on the end surfaces 111B, 112B, 113B, 114B, and 115B of the through electrodes 111 through 115, the electrode pad formation surfaces 95A and 96A of the second electronic components 95 and 96, and the second electrode pads 121 through 124, which are exposed at the multilayer interconnection structure formation surface 98B (that is, not covered with the sealing resin 98), by the same technique as in the above-described process illustrated in FIG. 3H. Examples of the insulating layer 56 include an insulating resin film (such as an epoxy resin film). The insulating layer 56 may be, for example, 5 μm to 30 μm in thickness.

The openings 151 are formed so as to expose the end surfaces 115B of the corresponding through electrodes 115. The opening 152 is formed so as to expose the end surface 113B of the through electrode 113. The opening 153 is formed so as to expose the end surface 111B of the through electrode 111. The opening 154 is formed so as to expose the connection surface 121A of the second electrode pad 121. The opening 155 is formed so as to expose the connection surface 122A of the second electrode pad 122. The opening 156 is formed so as to expose the connection surface 123A of the second electrode pad 123. The opening 157 is formed so as to expose the connection surface 124A of the second electrode pad 124. The opening 158 is formed so as to expose the end surface 112B of the through electrode 112. The opening 159 is formed so as to expose the end surface 114B of the through electrode 114.

Next, in the process illustrated in FIG. 3S, the vias 61, 62, 68, 69, 77, 78, and 85 are formed in the openings 152 and 153, 154, 155, 156, 158 and 159, 157, and 151, respectively, and the interconnects 63, 71, 79, and 86 are formed on the surface 56B of the insulating layer 56 at the same time by the same technique as in the above-described process illustrated in FIG. 3I.

The vias 61 are formed in the openings 152 and 153 so that the connection surfaces 61A connect to the end surfaces 111B and 113B of the through electrode 111 and 113, respectively. The via 62 is formed in the opening 154 so as to connect to the connection surface 121A of the second electrode pad 121. The via 68 is formed in the opening 155 so as to connect to the connection surface 122A of the second electrode pad 122. The via 69 is formed in the opening 156 so as to connect to the connection surface 123A of the second electrode pad 123. The vias 77 are formed in the openings 158 and 159 so that the connection surfaces 77A connect to the end surfaces 112B and 114B of the through electrodes 112 and 114, respectively. The via 78 is formed in the opening 157 so as to connect to the connection surface 124A of the second electrode pad 124. The vias 85 are formed in the corresponding openings 151 so that the connection surfaces 85A connect to the end surfaces 115B of the corresponding through electrodes 115.

The interconnect 63 is formed on the surface 56B of the insulating layer 56 as part of a unitary structure with the vias 61 and 62. The interconnect 71 is formed on the surface 56B of the insulating layer 56 as part of a unitary structure with the vias 68 and 69. The interconnect 79 is formed on the surface 56B of the insulating layer 56 as part of a unitary structure with the vias 77 and 78. The interconnects 86 are formed on the surface 56B of the insulating layer 56 as parts of respective unitary structures with the corresponding vias 85.

As a result, the second electrode pads 121 and 122 of the second electronic component 95 are directly connected to (or in direct contact with) the vias 62 and 68, respectively, and the second electrode pads 123 and 124 of the second electronic component 96 are directly connected to (or in direct contact with) the vias 69 and 78, respectively.

By thus connecting the second electrode pads 121 through 124 of the second electronic components 95 and 96 directly to the vias 62, 68, 69, and 78, it is possible to electrically connect the second electronic components 95 and 96 and the second multilayer interconnection structure 117 without using bumps or metal wires. Accordingly, the second semiconductor device 12 is reduced in size in its thickness directions.

Next, in the process illustrated in FIG. 3T, the insulating layer 57, the vias 64, 72, 81, and 87, and the interconnects 73, 82, 86, and 65; and the insulating layer 58, the vias 66, 74, 75, 83, and 89, and the external connection pads 43 through 47 are successively formed by the same techniques as in the above-described processes illustrated in FIGS. 3J and 3K.

As a result, the interconnection pattern 51 connected to the external connection pad 44, the second electronic component 95, and the through electrodes 111 and 113; the interconnection pattern 52 connected to the external connection pads 45 and 46 and the second electronic components 95 and 96; the interconnection pattern 53 connected to the external connection pad 47, the second electronic component 96, and the through electrodes 112 and 114; and the interconnection patterns 54 connected to the corresponding external connection pads 43 and through electrodes 115 are formed.

The insulating layers 57 and 58 may be, for example, insulating resin films (such as epoxy resin films). The insulating layers 57 and 58 may be, for example, 5 μm to 30 μm in thickness. Examples of the materials of the vias 64, 72, 81, 87, 66, 74, 75, 83, and 89, the interconnects 73, 82, 86, and 65, and the external connection pads 43 through 47 include Cu.

Next, in the process illustrated in FIG. 3U, the solder resist layer 128 is formed on the surface 58B of the insulating layer 58 of the structure illustrated in FIG. 3T so as to expose the connection surfaces 43A, 44A, 45A, 46A, and 47A of the external connection pads 43 through 47, and the resulting structure is turned upside down.

As a result, the second semiconductor device 12 is formed on the lower surface side of the first semiconductor device 11, so that the electronic device 10 having the first semiconductor device 11 and the second semiconductor device 12 according to the first embodiment is manufactured. The processes illustrated in FIGS. 3M through 3U may be referred to as a second semiconductor device forming step.

According to the electronic device 10 of this embodiment, the second semiconductor device 12 having the second electronic components 95 and 96 directly connected to the interconnection patterns 51 through 53 provided in the second multilayer interconnection structure 117 is formed on the first semiconductor device 11 having the first electronic components 15 and 16 directly connected to the interconnection patterns 51 through 53 provided in the first multilayer interconnection structure 25, and the first semiconductor device 11 is electrically connected to the second multilayer interconnection structure 117 and the second electronic components 95 and 96 through the through electrodes 111 through 115 provided in the second semiconductor device 12. This eliminates the need for bumps or metal wires for electrically connecting the interconnection patterns 51 through 53 and the first and the second electronic components 15, 16, 95, and 96; internal connection terminals for electrically connecting the first semiconductor device 11 and the second semiconductor device 12; and a gap for providing such internal connection terminals. Accordingly, the electronic device 10 is reduced in size in its thickness directions.

Further, compared with the case of electrically connecting the first semiconductor device 11 and the second semiconductor device 12 using internal connection terminals (such as solder balls), it is possible to increase the reliability of the electrical connection between the first semiconductor device 11 and the second semiconductor device 12 by electrically connecting the first semiconductor device 11 and the second semiconductor device 12 through the through electrodes 111 through 115.

This embodiment is described, taking the electronic device 10 as an example, where the first semiconductor device 11 including the through electrodes 21 through 23 and the sealing resin 18 and the second semiconductor device 12 including the through electrodes 111 through 115 and the sealing resin 98 are stacked. Here, as an alternative configuration, the first semiconductor device 11 provided in the electronic device 10 may be replaced with, for example, a common electronic-component-containing board (for example, a board having an electronic component such as a semiconductor chip built in a multilayer interconnection structure).

[b] Second Embodiment

Figure 4:
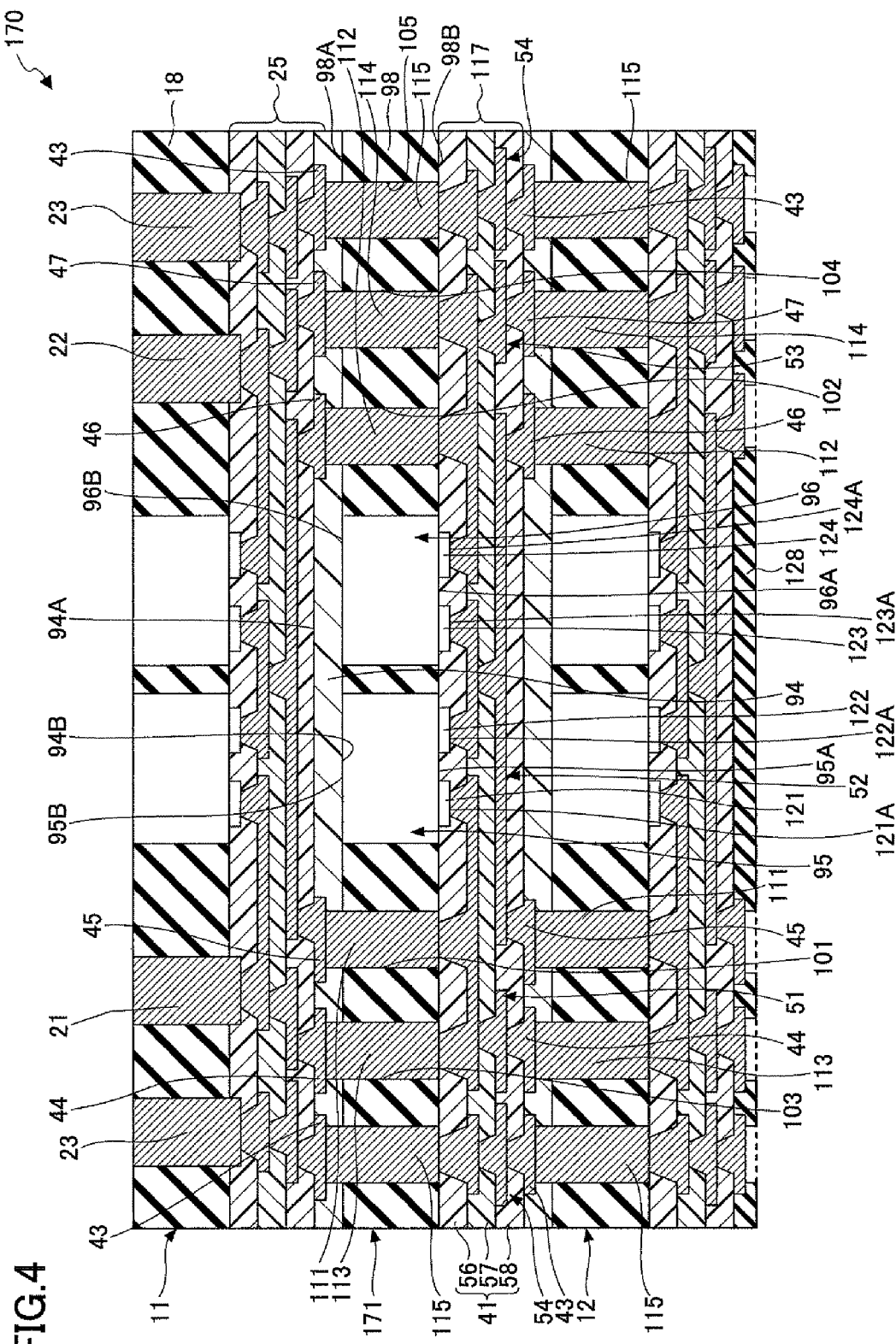
FIG. 4 is a cross-sectional view of an electronic device according to a second embodiment of the present invention.

FIG. 4 is a cross-sectional view of an electronic device 170 according to a second embodiment of the present invention. In FIG. 4, the same elements as those of the electronic device 10 of the first embodiment are referred to by the same reference numerals.

Referring to FIG. 4, the electronic device 170 of the second embodiment has the same configuration as the electronic device 10 of the first embodiment except that the electronic device 170 further includes a third semiconductor device 171 in addition to the configuration of the electronic device 10.

The third semiconductor device 171 is interposed between the first semiconductor device 11 and the second semiconductor device 12. The third semiconductor device 171 is equal in configuration to the second semiconductor device 12 without the solder resist layer 128.

The through electrodes 111 through 115 of the third semiconductor device 171 are connected to the external connection pads 43 through 47 of the first semiconductor device 11. As a result, the third semiconductor device 171 is electrically connected to the first semiconductor device 11.

The external connection pads 43 through 47 of the third semiconductor device 171 are connected to the through electrodes 111 through 115 of the second semiconductor device 12. As a result, the third semiconductor device 171 is electrically connected to the second semiconductor device 12. Further, the first semiconductor device 11 is electrically connected to the second semiconductor device 12 through the third semiconductor device 171.

Thus, the electronic device may be configured by stacking two or more semiconductor devices. The electronic device 170 of the second embodiment having the above-described configuration produces the same effects as the electronic device 10 of the first embodiment.

The electronic device 170 of this embodiment produces the same effects as the electronic device 10 of the first embodiment. Further, the electronic device 170 of the second embodiment may be manufactured by executing the processes of the processes of FIGS. 3A through 3T described in the first embodiment, thereafter executing the processes of the processes of FIGS. 3M through 3T described in the first embodiment, and thereafter executing the process of FIG. 3U described in the first embodiment.

This embodiment is described, taking the electronic device 170 as an example, where the first semiconductor device 11 including the through electrodes 21 through 23 and the sealing resin 18, the third semiconductor device including the through electrodes 111 through 115 and the sealing resin 98, and the second semiconductor device 12 including the through electrodes 111 through 115 and the sealing resin 98 are stacked. Here, as an alternative configuration, the first semiconductor device 11 provided in the electronic device 170 may be replaced with, for example, a common electronic-component-containing board (for example, a board having an electronic component such as a semiconductor chip built in a multilayer interconnection structure).

Further, two or more third semiconductor devices 171 may be interposed between the first semiconductor device 11 and the second semiconductor device 12.

According to one aspect of the present invention, a gap is eliminated between a first semiconductor device and a second semiconductor device, and a pad (one of the elements of the first semiconductor device) and an interconnection pattern (one of the elements of the second semiconductor device) are electrically connected via a through electrode. This makes it possible to reduce the size of the electronic device in its thickness directions.

Further, according to one aspect of the present invention, an interconnection pattern and an electrode pad of an electronic component are directly connected in a first semiconductor device, and an interconnection pattern and an electrode pad of a second electronic component are directly connected in a second semiconductor device. This reduces the size of the first electronic component and the second electronic component in their thickness directions, so that it is possible to reduce the size of the electronic device in its thickness directions.

Further, according to one aspect of the present invention, a first semiconductor device and a second semiconductor device are electrically connected via a through electrode. This increases the reliability of the electrical connection between the first semiconductor device and the second semiconductor device compared with the case of electrically connecting the first semiconductor device and the second semiconductor device using internal connection terminals (such as solder balls).

Further, according to one aspect of the present invention, a second semiconductor device having a second electronic component directly connected to a second interconnection pattern provided in the second multilayer interconnection structure is formed on a first semiconductor device having a first electronic component directly connected to a first interconnection pattern provided in a first multilayer interconnection structure, and the first semiconductor device is electrically connected to the second multilayer interconnection structure and the second electronic component via a through electrode provided in the second semiconductor device. This eliminates the need for: bumps or metal wires for electrically connecting the first and the second interconnection pattern and the first and the second electronic component; internal connection terminals for electrically connecting the first semiconductor device and the second semiconductor device; and a gap for providing such internal connection terminals. Accordingly, it is possible to reduce the size of the electronic device in its thickness directions.

Further, compared with the case of electrically connecting the first semiconductor device and the second semiconductor device using internal connection terminals (such as solder balls), it is possible to increase the reliability of the electrical connection between the first semiconductor device and the second semiconductor device by electrically connecting the first semiconductor device and the second semiconductor device via the through electrode.

Thus, according to one aspect of the present invention, it is possible to reduce the size of an electronic device in its thickness directions, and to increase the reliability of the electrical connection between a first semiconductor device and a second semiconductor device.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present inventions have been described in detail, it should be understood that various changes, substitutions, and alterations could be made hereto without departing from the spirit and scope of the invention.

What is claimed is:
1. An electronic device, comprising:
a first semiconductor device including
a first electronic component having a first surface and a second surface facing away from each other, the first surface having a first electrode pad provided thereon;
a first sealing resin having a first surface and a second surface facing away from each other, the first sealing resin sealing side surfaces of the first electronic component so that the first surface and the second surface of the first electronic component are exposed at the first surface and the second surface, respectively, of the first sealing resin; and
a first multilayer interconnection structure including a plurality of insulating layers and a first interconnection pattern, the insulating layers being stacked to cover the first surface of the first electronic component and the first surface of the first sealing resin, the first interconnection pattern being directly connected to the first electrode pad; and
a second semiconductor device including
a second electronic component having a first surface and a second surface facing away from each other, the first surface having a second electrode pad provided thereon;
a second sealing resin having a first surface and a second surface facing away from each other, the second sealing resin sealing side surfaces of the second electronic component so that the first surface and the second surface of the second electronic component are exposed at the first surface and the second surface, respectively, of the second sealing resin; and a second multilayer interconnection structure including a plurality of insulating layers and a second interconnection pattern, the insulating layers being stacked to cover the first surface of the second electronic component and the first surface of the second sealing resin, the second interconnection pattern being directly connected to the second electrode pad, wherein the first semiconductor device is stacked on and bonded to the second semiconductor device through an adhesive layer with the first multilayer interconnection structure of the first semiconductor device facing toward the second sealing resin of the second semiconductor device, and the first interconnection pattern and the second interconnection pattern are connected through a through electrode provided through the adhesive layer and the second sealing resin.

2. The electronic device as claimed in claim 1, wherein the through electrode has a first end surface and a second end surface, the first end surface being connected to a first pad of the first interconnection pattern, the second end surface being connected to a via of the second interconnection pattern.

3. The electronic device as claimed in claim 1, wherein the first interconnection pattern is connected to an additional through electrode provided through the first sealing resin.

4. The electronic device as claimed in claim 1, wherein a diameter of the through electrode is constant through the second sealing resin and the adhesive layer.

5. The electronic device as claimed in claim 1, wherein the through electrode has an end thereof directly connected to the first interconnection pattern.

6. A method of manufacturing an electronic device, comprising:

forming a first semiconductor device including a first electronic component having a first surface and a second surface facing away from each other, the first surface having a first electrode pad provided thereon; a first sealing resin having a first surface and a second surface facing away from each other, the first sealing resin being provided to seal side surfaces of the first electronic component so that the first surface and the second surface of the first electronic component are exposed at the first surface and the second surface, respectively, of the first sealing resin; and a first multilayer interconnection structure including a plurality of insulating layers and a first interconnection pattern, the insulating layers being stacked to cover the first surface of the first electronic component and the first surface of the first sealing resin, the first interconnection pattern being directly connected to the first electrode pad; and forming a second semiconductor device, said forming the second semiconductor device including preparing a second electronic component having a first surface and a second surface facing away from each other, the first surface having a second electrode pad provided thereon, and forming a second sealing resin having a first surface and a second surface facing away from each other, the second sealing resin sealing side surfaces of the second electronic component so that the first surface and the second surface of the second electronic component are exposed at the first surface and the second surface, respectively, of the second sealing resin;

stacking the second sealing resin on the first multilayer interconnection structure with an adhesive layer being interposed between the second surface of the second sealing resin and the first multilayer interconnection structure;

forming a through electrode through the second sealing resin and the adhesive layer, the through electrode being connected to the first interconnection pattern; and forming a second multilayer interconnection structure including a plurality of insulating layers and a second interconnection pattern, the insulating layers being stacked to cover the first surface of the second electronic component and the first surface of the second sealing resin, the second interconnection pattern being directly connected to the second electrode pad.

7. The method as claimed in claim 6, wherein said forming the through electrode in said forming the second semiconductor device connects a first end surface of the through electrode to a first pad of the first interconnection pattern and connects a second end surface of the through electrode to a via of the second interconnection pattern.

8. The method as claimed in claim 6, wherein said forming the first semiconductor device includes forming an additional through electrode through the first sealing resin, the additional through electrode being connected to the first interconnection pattern.

9. The method as claimed in claim 6, wherein said forming the through electrode forms the through electrode so that a diameter of the through electrode is constant through the second sealing resin and the adhesive layer.

10. The method as claimed in claim 6, wherein said forming the through electrode directly connects an end of the through electrode to the first interconnection pattern.

11. The method as claimed in claim 6, wherein said forming the through electrode is performed after said stacking the second sealing resin on the first multilayer interconnection structure with the adhesive layer being interposed between the second surface of the second sealing resin and the first multilayer interconnection structure.

* * * * *